(12) United States Patent
Lee et al.

(10) Patent No.: US 11,595,016 B2
(45) Date of Patent: Feb. 28, 2023

(54) BULK-ACOUSTIC WAVE RESONATOR

(71) Applicant: Samsung Electro-Mechanics Co., Ltd., Suwon-si (KR)

(72) Inventors: Tae Kyung Lee, Suwon-si (KR); Jin Suk Son, Suwon-si (KR); Je Hong Kyoung, Suwon-si (KR); Sung Sun Kim, Suwon-si (KR); Ran Hee Shin, Suwon-si (KR); Hwa Sun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 978 days.

(21) Appl. No.: 16/395,486

(22) Filed: Apr. 26, 2019

(65) Prior Publication Data

US 2020/0112296 A1 Apr. 9, 2020

(30) Foreign Application Priority Data

Oct. 5, 2018 (KR) .......................... 10-2018-0118730
Nov. 28, 2018 (KR) .......................... 10-2018-0149571

(51) Int. Cl.
  *H03H 9/02* (2006.01)
  *H03H 9/17* (2006.01)
(52) U.S. Cl.
  CPC .... *H03H 9/02015* (2013.01); *H03H 9/02047* (2013.01); *H03H 9/17* (2013.01)
(58) Field of Classification Search
  CPC ... H03H 9/02015; H03H 9/02047; H03H 9/17
  See application file for complete search history.

(56) References Cited

U.S. PATENT DOCUMENTS

| 2005/0029629 | A1  |  2/2005 | Noguchi et al. |
| 2013/0127300 | A1* |  5/2013 | Umeda ................... H03H 9/173 310/365 |
| 2013/0181579 | A1  |  7/2013 | Shin et al. |
| 2014/0292150 | A1* | 10/2014 | Zou ........................ G10K 9/122 310/346 |
| 2017/0179923 | A1  |  6/2017 | Shin et al. |
| 2017/0366157 | A1* | 12/2017 | Liu .......................... H03H 3/04 |
| 2017/0373665 | A1* | 12/2017 | Lee .......................... H03H 9/54 |
| 2018/0076377 | A1* |  3/2018 | Park ....................... H03H 9/0211 |

(Continued)

FOREIGN PATENT DOCUMENTS

| JP | 5-183378 A |  7/1993 |
| JP | 5-267976 A | 10/1993 |

(Continued)

OTHER PUBLICATIONS

Korea Office Action dated Feb. 12, 2020 in the corresponding Korean Patent Application No. 10-2018-0149571 (6 pages in English, 6 pages in Korean).

*Primary Examiner* — Bryan P Gordon
(74) *Attorney, Agent, or Firm* — NSIP Law

(57) ABSTRACT

A bulk-acoustic wave resonator includes: a substrate; a seed layer disposed on the substrate, and having a hexagonal crystal structure; a bottom electrode disposed on the seed layer; a piezoelectric layer at least partially disposed on the bottom electrode; and a top electrode disposed on the piezoelectric layer, wherein either one or both of the bottom electrode and the top electrode includes a scandium (Sc)-containing aluminum alloy layer.

18 Claims, 19 Drawing Sheets

(56) References Cited

U.S. PATENT DOCUMENTS

2018/0085787 A1* 3/2018 Burak ................ H03H 9/02118
2018/0254764 A1   9/2018 Lee et al.
2018/0262180 A1   9/2018 Lee et al.
2018/0351534 A1* 12/2018 Lee .......................... H03H 3/02

FOREIGN PATENT DOCUMENTS

| JP | 2005-56940 A | 3/2005 |
| KR | 10-2013-0084860 A | 7/2013 |
| KR | 10-2017-0073063 A | 6/2017 |
| KR | 10-2018-0101129 A | 9/2018 |
| KR | 10-2018-0102971 A | 9/2018 |

* cited by examiner

BULK-ACOUSTIC WAVE RESONATOR

CROSS-REFERENCE TO RELATED APPLICATIONS

This application claims benefit under 35 U.S.C. § 119(a) of Korean Patent Application Nos. 10-2018-0118730 and 10-2018-0149571 filed on Oct. 5, 2018 and Nov. 28, 2018, respectively, in the Korean Intellectual Property Office, the entire disclosures of which are incorporated herein by reference for all purposes.

BACKGROUND

The following description relates to a bulk-acoustic wave resonator.

Recently, interest in fifth-generation (5G) communications technology has increased and technical developments, which may be implemented in candidate bands of 5G communications, have been made.

A frequency band that may be implemented by a film bulk acoustic resonator (FBAR) is about 6 GHz or less. In the case of an FBAR operating in a frequency band of 2 to 3 GHz, a suitable thickness of an electrode and a suitable thickness of a piezoelectric layer may be easily implemented. However, in the case of an FBAR operating in a 5 GHz frequency band, considerable manufacturing difficulties and deteriorations in performance may be expected to occur.

In particular, in the case of an FBAR operating in a 5 GHz frequency band, an ultra-thin film electrode needs to be implemented and the piezoelectric layer also needs to be thin. However, when an electrode material having a high degree of high acoustic impedance, such as molybdenum (Mo), is used, electrical loss may be expected to increase as the thickness of the electrode decreases. Therefore, electrical loss in the resonator and a filter device including the resonator may be expected to increase.

However, when an electrode material having low acoustic impedance, such as aluminum (Al), is used, since mechanical properties of aluminum (Al) may be poor, mechanical dynamic loss is expected to be high, and crystal orientation is deteriorated when the piezoelectric layer is formed.

For example, when an electrode material having high acoustic impedance, such as molybdenum (Mo), is used, each of a top electrode and a bottom electrode may have a thickness of 1,000 angstroms (Å) and the piezoelectric layer may have a thickness of 3,000 Å, such that the operating frequency of 5 GHz may be implemented. However, when the electrode material having low acoustic impedance, such as aluminum (Al), is used, even when each of the top electrode and the bottom electrode has a thickness of 2,000 Å and the piezoelectric layer has a thickness of is 4,000 Å, the frequency of 5 GHz may be implemented. As a result, the frequency of 5 GHz may be implemented even in a greater thickness. If a piezoelectric layer and an electrode may increase in thickness, characteristics of the filter may be maintained, even in a higher power environment.

However, in the case in which the top electrode and the bottom electrode are formed of aluminum (Al) only, mechanical properties may be deteriorated, while crystal orientation of the piezoelectric layer and performance of the resonator may be deteriorated by a hillock caused by electromigration or mechanical deformation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a substrate; a seed layer disposed on the substrate, and having a hexagonal crystal structure; a bottom electrode disposed on the seed layer; a piezoelectric layer at least partially disposed on the bottom electrode; and a top electrode disposed on the piezoelectric layer, wherein either one or both of the bottom electrode and the top electrode includes a scandium (Sc)-containing aluminum alloy layer.

The seed layer may include titanium (Ti).

The seed layer may include ruthenium (Ru).

The bottom electrode and the top electrode may each include the scandium (Sc)-containing aluminum alloy layer.

The top electrode may further include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

The bottom electrode may further include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

Only the bottom electrode may include the scandium (Sc)-containing aluminum alloy layer. The top electrode may include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

The bottom electrode may further include another layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

Only the top electrode may include the scandium (Sc)-containing aluminum alloy layer. The bottom electrode may include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

The top electrode may further include another layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

A content of scandium (S) in the scandium (Sc)-containing aluminum alloy layer may be in a range of 0.1 to 5 atomic percent (at %).

The piezoelectric layer may include an aluminum nitride or a doped aluminum nitride containing a rare earth metal.

The doped aluminum nitride may include a dopant selected from the group consisting of scandium (Sc), erbium (Er), yttrium (Y), and lanthanum (La), or combinations of scandium (Sc), erbium (Er), yttrium (Y), and lanthanum (La), and a content of the dopant in the doped aluminum nitride may be in a range of 0.1 to 30 at %.

The bulk-acoustic wave resonator may further include: an etch stop portion disposed between the substrate and the bottom electrode, and disposed around a cavity.

The bulk-acoustic wave resonator may further include: an insertion layer disposed below a region of a portion of the piezoelectric layer.

A cavity may be formed on the substrate or in the substrate.

The top electrode may include a frame portion disposed at an edge of an active region of the bulk-acoustic wave resonator.

The bulk-acoustic wave resonator may further include: a reflective layer embedded in a groove on the substrate or laminated on the substrate.

The reflective layer may include a first reflective member, and a second reflective member disposed on the first reflective member. The first and second reflective members may be provided as a pair, or may be provided as a plurality of pairs in which the first and second reflective members are alternately disposed.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
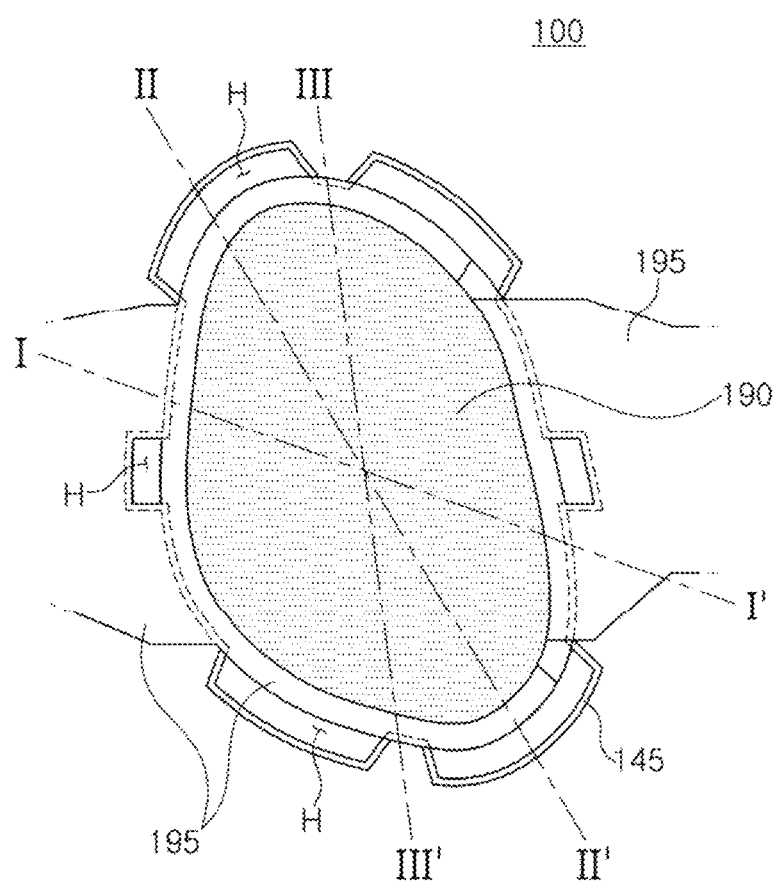
FIG. 1 is a plan view of a bulk-acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
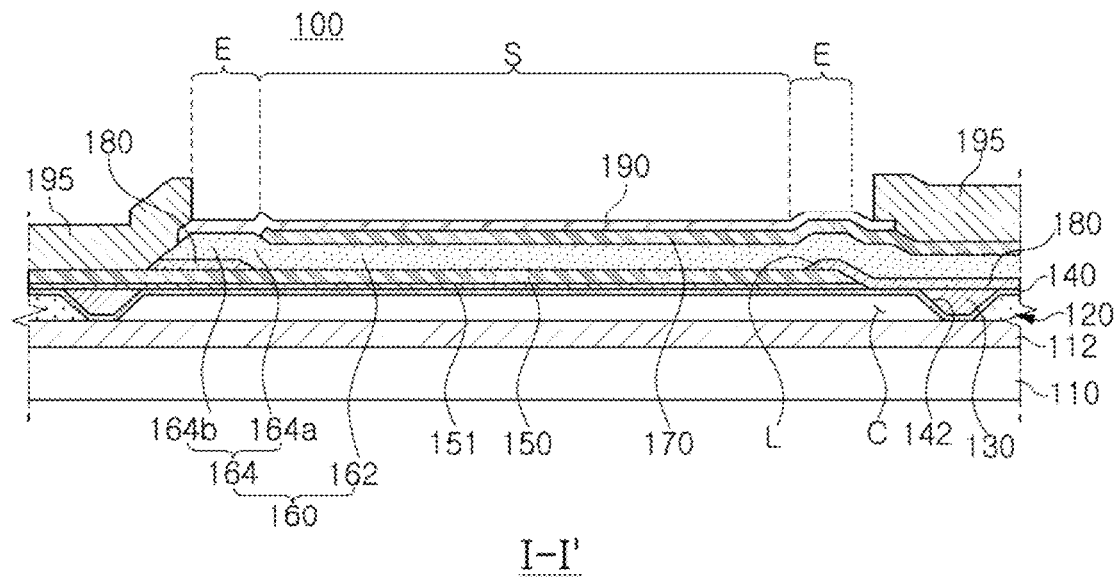
FIG. 2 is a cross-sectional view taken along line I-I' in FIG. 1.
Figure 3:
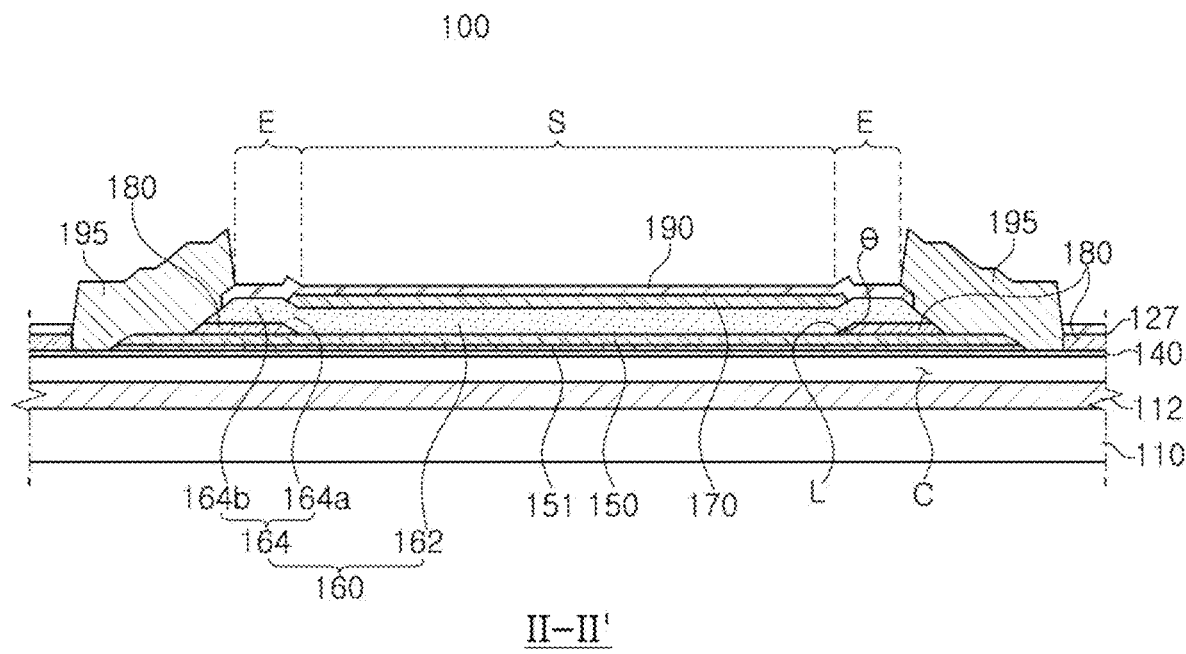
FIG. 3 is a cross-sectional view taken along line II-II' in FIG. 1.
Figure 4:
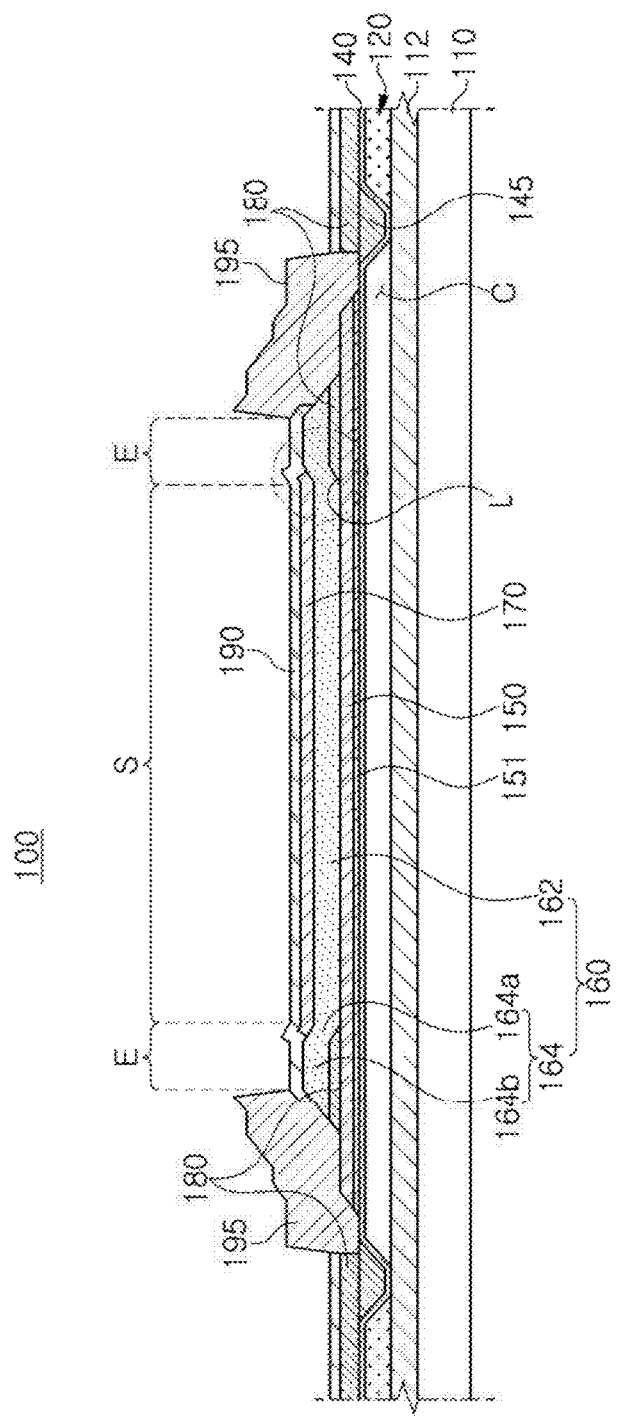
FIG. 4 is a cross-sectional view taken along line III-Ill' in FIG. 1.

FIG. 1 is a plan view of a bulk-acoustic wave resonator 100, according to an embodiment. FIG. 2 is a cross-sectional view taken along line I-I' in FIG. 1. FIG. 3 is a cross-sectional view taken along line II-II' in FIG. 1. FIG. 4 is a cross-sectional view taken along line III-III' in FIG. 1.

Referring to FIGS. 1 to 4, the bulk-acoustic wave resonator 100 may include a substrate 110, a sacrificial layer 120, an etch stop portion 130, a membrane layer 140, a bottom electrode 150, a piezoelectric layer 160, a top electrode 170, an insertion layer 180, a passivation layer 190, and a metal pad 195.

The substrate 110 may be a silicon substrate. For example, a silicon wafer or a silicon-on-insulator (SOI) type substrate may be used as the substrate 110.

An insulating layer 112 may be disposed on a top surface of the substrate 110 and may electrically isolate the substrate 110 from components disposed on the substrate 110. In addition, when a cavity C is formed during a manufacturing process, the insulating layer 112 may prevent the substrate 110 from being etched by an etching gas.

In this case, the insulating layer 112 may be formed of any one or any combination of any two or more of silicon dioxide ($SiO_2$), silicon nitride ($Si_3N_4$), aluminum oxide ($Al_2O_3$), and aluminum nitride (AlN). The insulating layer 112 may be formed by any one of a chemical vapor deposition process, an RF magnetron sputtering process, and an evaporation process.

The sacrificial layer 120 may be disposed on the insulating layer 112, and the cavity C and the etch stop portion 130 may be disposed inside the sacrificial layer 120. The cavity C may be formed by removing a portion of the sacrificial layer 120 during the manufacturing process. As described above, since the cavity C is formed inside the sacrificial layer 120, the bottom electrode 150 or the like, disposed on the sacrificial layer 120, may be formed to be flat.

The etch stop portion 130 may be disposed along a boundary of the cavity C. The etch stop portion 130 may prevent the etching from being performed beyond a region of the cavity during a process of forming the cavity C.

The membrane layer 140 may form the cavity C together with the substrate 110. In addition, the membrane layer 140 may be formed of a material having low reactivity with an etching gas when the sacrificial layer 120 is removed. The etch stop portion 130 may be inserted into a groove portion 142 formed by the membrane layer 140. The membrane layer 140 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO).

A seed layer 151 may be disposed on the substrate 110. More specifically, the seed layer 151 may be disposed on the membrane layer 140. For example, the seed layer 151 may be disposed between the membrane layer 140 and the bottom electrode 150. The seed layer 151 may have a hexagonal crystal structure to reduce lattice mismatch of the bottom electrode 150 and improve sheet resistance of the bottom electrode 150. As an example exhibiting such effects, the seed layer 151 may include a titanium (Ti) element and may be implemented as, for example, a Ti layer. In addition, the seed layer 151 may include a ruthenium (Ru) element and may be implemented as, for example, a Ru layer. The seed layer 151 will be described later in detail.

The bottom electrode 150 may be disposed on the membrane layer 140 and may have a portion disposed on the cavity C. In addition, the bottom electrode 150 may be used as either one of an input electrode and an output electrode inputting and outputting, respectively, an electrical signal such as a radio-frequency (RF) signal or the like.

The bottom electrode 150 may be formed of, for example, a scandium-containing aluminum alloy. As such, the bottom electrode 150 may be formed of the scandium-containing aluminum alloy (Sc), such that high power reactive sputtering may be performed as mechanical strength is increased. Under such a deposition condition, surface roughness of the bottom electrode 150 may be prevented from increasing and high orientation growth of the piezoelectric layer 160 may also be induced.

Since the bottom electrode 150 contains scandium (Sc), chemical resistance of the bottom electrode 150 may be increased to suppress an irregularity caused when the bottom electrode is formed of pure aluminum. Further, stability of a process such as dry etching, wet etching, or the like may be secured during the manufacturing process. Moreover, oxidation may easily occur in the case in which a bottom electrode is formed of pure aluminum. However, since the bottom electrode 150 is formed of the scandium-containing aluminum alloy, chemical resistance against oxidation may be increased.

For comparison, an electrode having a thickness of 1,500 Å was formed of an aluminum alloy (AlSc) containing 0.625% of scandium, and another electrode having a thickness of 1,500 Å was formed of molybdenum (Mo). The electrode formed of molybdenum (Mo) had a measured sheet resistance of 0.9685. However, the electrode formed of the aluminum alloy (AlSc) containing 0.625 at % of scandium had a measured sheet resistance of 0.316. Thus, as described above, the sheet resistance of an electrode formed of the aluminum alloy (AlSc) is lower than the sheet resistance of an electrode of the same thickness and formed of molybdenum (Mo).

A content of scandium (Sc) may be 0.1 at % to 5 at %. For example, when the content of scandium (Sc) is less than 0.1 at %, degradation in mechanical properties and hillock may be caused by aluminum (Al). When the content of scandium (Sc) is 5 at % or more, it may be difficult to address electrical loss. Additionally, when the content of scandium (Sc) is increased, surface roughness may be increased to have an adverse influence on crystal orientation.

TABLE (1)

| Material | Yield Strength | Elongation |
| --- | --- | --- |
| Pure Al | 35 Mpa | 45% |
| AlSc (Sc 0.625 at %) | 300 Mpa | 15% |

As illustrated in Table (1), it can be seen that the material of aluminum alloy (AlSc, 0.625 at %) containing scandium has increased yield strength and reduced elongation as compared to pure aluminum (Al).

Figure 5:
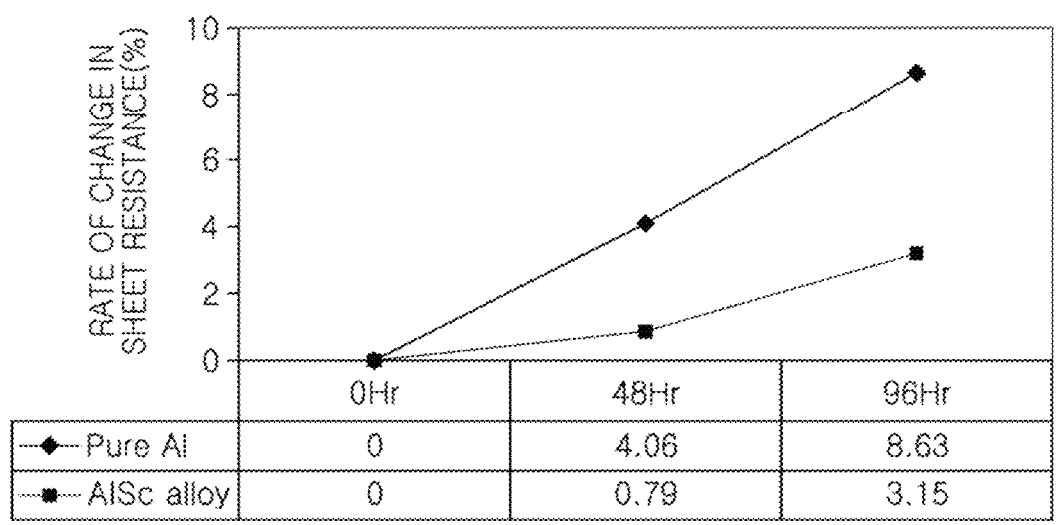
FIG. 5 is a graph illustrating a rate of change in sheet resistance of an aluminum alloy including pure aluminum and scandium.

As illustrated in FIG. 5, the pure aluminum (Al) and the material of aluminum alloy (AlSc, 0.625 at %) containing scandium (Sc) were each deposited to have a thickness of 1,500 Å and a change in sheet resistance was measured in a reliable environment. As a result, if comparing a rate of change in sheet resistance after 96 hours, the material of aluminum alloy (AlSc, 0.625 at %) containing scandium exhibited a rate of change in sheet resistance of about 50% of the rate of change in sheet resistance of the pure aluminum (Al). Accordingly, it can be seen that an oxidation resistance characteristic of the scandium-containing aluminum alloy is improved in comparison to pure aluminum.

Since the bottom electrode 150 has improved galvanic corrosion characteristics with the metal pad 195, stability in the manufacturing process may be obtained. For example, the pure aluminum (Al) and the material of the aluminum alloy (AlSc, 0.625 at %) containing scandium were deposited to have the thickness of 1500 Å, then were brought into contact with gold (Au), which is mainly used as a material of the metal pad 195, and then immersed in an electrolyte solution for 65 hours to compare galvanic corrosion characteristics. As a result, a change in a surface was not observed in the material of aluminum alloy (AlSc, 0.625 at %) containing scandium, but corrosion with gold (Au) was observed in the pure aluminum. Accordingly, when the bottom electrode 150 is formed of an aluminum alloy (AlSc) containing scandium, improved characteristics for galvanic corrosion may be provided in the manufacturing process.

The bottom electrode 150 may be formed of an aluminum alloy (AlSc) containing only scandium (Sc). For example, the bottom electrode 150 may not contain additional metals, except for aluminum and scandium (Sc). If additional metals, except for aluminum and scandium (Sc), are contained, such an aluminum alloy may form a ternary system in a phase diagram. In this case, it may be difficult to control a combination, and by having a complicated phase system, composition unevenness and an undesired crystal phase may be formed.

In the case in which the bottom electrode 150 is formed of the aluminum alloy including the ternary system, surface roughness may be increased due to the formation of composition unevenness and the undesired crystal phase to have an adverse influence on crystal orientation when the piezoelectric layer 160 is formed.

Accordingly, since the bottom electrode 150 is formed of an aluminum alloy (AlSc) containing only scandium (Sc), crystal orientation of the piezoelectric layer 160 disposed on the bottom electrode 150 may be improved, which will be described later in detail.

The piezoelectric layer 160 may be disposed to cover a portion of the bottom electrode 150 disposed on the cavity C. The piezoelectric layer 160 is a portion in which a piezoelectric effect, which converts electric energy into mechanical energy in a form of an elastic wave, occurs. The piezoelectric layer 160 may be formed of any one of aluminum nitride (AlN), zinc oxide (ZnO), and lead zirconium titanium oxide (PZT; PbZrTiO). In detail, in a case in which the piezoelectric layer 160 is formed of aluminum nitride (AlN), the piezoelectric layer 160 may further include a rare earth metal. As an example, the rare earth metal may include any one or any combination of any two or more of scandium (Sc), erbium (Er), yttrium (Y), and lanthanum (La). As an example, the transition metal may include any one or any combination of any two or more of titanium (Ti), zirconium (Zr), hafnium (Hf), tantalum (Ta), and niobium (Nb). The transition metal may also include magnesium (Mg), which is a divalent metal.

A content of elements included in aluminum nitride (AlN) to improve piezoelectric characteristics may be, in detail, 0.1 to 30 at %. When the amount of elements included to improve piezoelectric characteristics is less than 0.1 at %, piezoelectric characteristics higher than those of aluminum nitride (AlN) may not be implemented. When the content of elements included to improve piezoelectric characteristics is greater than 30 at %, it may be difficult to implement manufacturing for deposition and composition control, and thus a non-uniform phase may be formed.

The piezoelectric layer 160 may include a piezoelectric portion 162 disposed in a planar portion S, and a bending portion 164 disposed in an extending portion E.

The piezoelectric portion 162 may be a portion directly stacked on the top surface of the bottom electrode 150. Therefore, the piezoelectric portion 162 may be interposed between the bottom electrode 150 and the top electrode 170 to be coplanar with the bottom electrode 150 and the top electrode 170.

The bending portion 164 may be a region extended outwardly of the piezoelectric portion 162 to be disposed in the extending portion E.

The bending portion 164 may be disposed on the insertion layer 180, which will be described later, and may be formed to be uplifted along a shape of the insertion layer 180. Accordingly, the piezoelectric layer 160 may be bent at a boundary between the piezoelectric portion 162 and the bending portion 164, and the bending portion 164 may be raised or uplifted to conform to a thickness and a shape of the insertion layer 180.

The bending portion 164 may include an inclined portion 164a and an extended portion 164b.

The inclined portion 164a is a portion inclined along an inclined surface L of the insertion layer 180. The extended portion 164b is a portion extended outwardly of the inclined portion 164a.

The inclined portion 164a may be formed parallel to the inclined surface L of the insertion layer 180, and an inclination angle of the inclined portion 164a may be the same as an inclination angle ($\theta$ in FIG. 3) of the inclined surface L of the insertion layer 180.

The top electrode 170 may be formed to cover a portion of the piezoelectric layer 160 disposed on the cavity C. The top electrode 170 may be used as either one of an input electrode and an output electrode inputting and outputting, respectively, an electrical signal such as a radio-frequency (RF) signal, or the like. For example, in a case in which the bottom electrode 150 is used as an input electrode, the top electrode 170 may be used as an output electrode. In a case in which the bottom electrode 150 is used as an output electrode, the top electrode 170 may be used as an input electrode.

Similarly to the bottom electrode 150, the top electrode 170 may also be formed of a scandium-containing aluminum alloy (Sc).

The insertion layer 180 may be disposed between the bottom electrode 150 and the piezoelectric layer 160. The insertion layer 180 may be formed of a dielectric such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from a material of the piezoelectric layer 160. A region in which the insertion layer 180 is formed may also be formed as an air space, as needed, which may be implemented by removing the insertion layer 180 during the manufacturing process. The insertion layer 180 may be implemented using a metal material, for example, an aluminum (Al) material or an Al alloy.

In the embodiment of FIGS. 1 to 4, the insertion layer 180 may have a thickness that is less than a thickness of the bottom electrode 150. In the case in which the insertion layer 180 has a thickness that is greater than the thickness of the piezoelectric layer 160, it may be difficult to form a bending portion climbing over the insertion layer 180. In the case in which the insertion layer 180 has a thickness of 100 Å or more, a bending portion may be easily formed and a sound wave of a resonator travelling in a horizontal direction may be effectively blocked to improve performance of the resonator.

The insertion layer 180 may be disposed along a surface formed by the membrane layer 140, the bottom electrode 150, and the etch stop portion 130.

The insertion layer 180 may be disposed around the planar portion S to support the bending portion 164 of the piezoelectric layer 160. Thus, the bending portion 164 of the piezoelectric layer 160 may be divided into the inclined portion 164a and the extended portion 164b depending on the shape of the insertion layer 180.

The insertion layer 180 may be disposed in a region other than the planar portion S. For example, the insertion layer 180 may be disposed in the entire region other than the planar portion S or in a portion of a region other than the planar portion S.

The insertion layer 180 may have at least a portion disposed between the piezoelectric layer 160 and the bottom electrode 150.

A side surface of the insertion layer 180, disposed along a boundary of the planar portion S, may have a thickness increasing as a distance from the planar portion S increases. Thus, the side surface of the insertion layer 180, which is disposed adjacent to the planar portion S, may be formed as the inclined surface L having a constant inclination angle $\theta$.

In a case in which the side surface of the insertion layer 180 is formed to have an inclination angle $\theta$ less than 5 degrees, it may be difficult to implement the insertion layer 180 because the thickness of the insertion layer 180 needs to be significantly small or an area of the inclined surface L needs to be excessively large.

When the side surface of the insertion layer 180 is formed to have an inclination angle $\theta$ greater than 70 degrees, the inclination angle of the inclined portion 164a of the piezoelectric layer 160, stacked on the insertion layer 180, may also be greater than 70 degrees. In this case, since the piezoelectric layer 160 is significantly bent, cracking may occur in a bent portion of the piezoelectric layer 160.

Accordingly, in the embodiment of FIGS. 1 to 4, the inclination angle $\theta$ of the inclined surface L may be in the range of 5 degrees to 70 degrees.

The passivation layer 190 may be formed on the bottom electrode 150 and a region excluding a portion of the top electrode 170. The passivation layer 190 may prevent damage to the top electrode 170 and the bottom electrode 150 during a manufacturing process.

Further, a portion of the passivation layer 190 may be removed by etching for frequency control in a final manufacturing process. For example, a thickness of the passivation layer 190 may be controlled. As an example, the passivation layer 190 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO).

The metal pad 195 may be formed on the bottom electrode 150 and the portion of the top electrode 170 on which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy or an aluminum-scandium (Al—Sc) alloy.

As described above, since the bottom electrode 150 and the top electrode 170 are formed of a scandium-containing aluminum alloy, electrical loss may be addressed.

Moreover, since mechanical strength may be improved, the piezoelectric layer 160 may be more stably deposited during a sputtering process to improve crystal orientation, and chemical resistance may be improved to secure manufacturing stability.

More specifically, after aluminum alloy (AlSc), containing pure aluminum (Al) and scandium (Sc), is deposited to have a thickness of 1,500 Å, and surface defect of the deposited aluminum alloy (AlSc) is observed. Many defects, caused by hillocks and grain boundary grooves, are observed in the case of the pure aluminum (Al), while the defects are significantly reduced in the case of the scandium-containing aluminum alloy.

Figure 6:
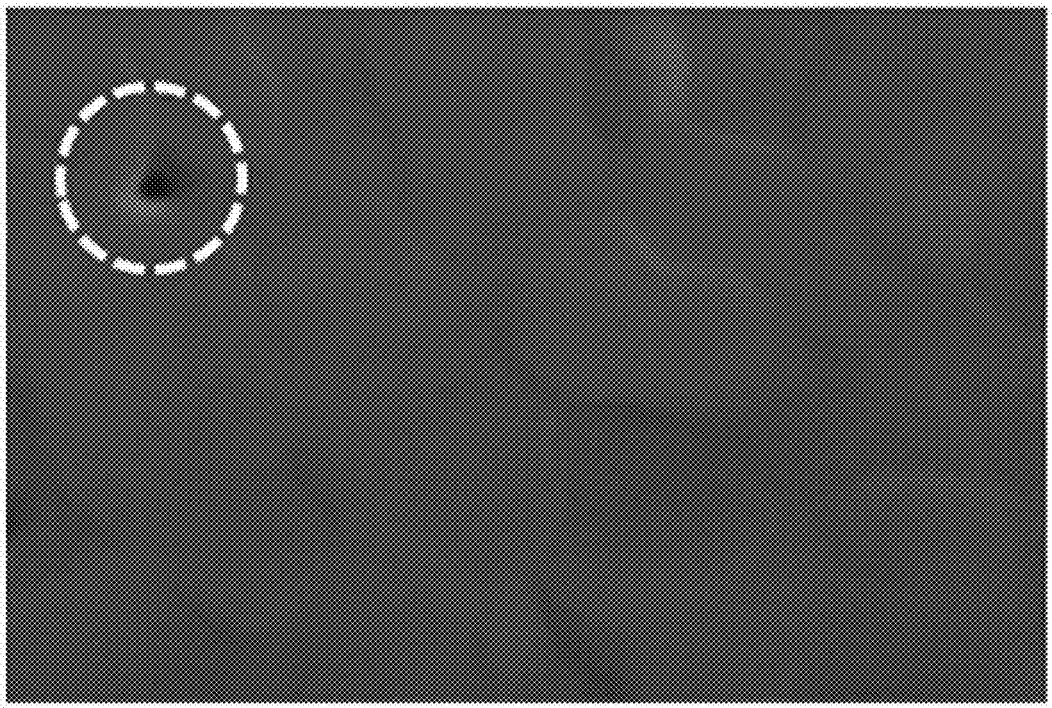
FIG. 6 is an image illustrating surface defects of pure aluminum.
Figure 7:
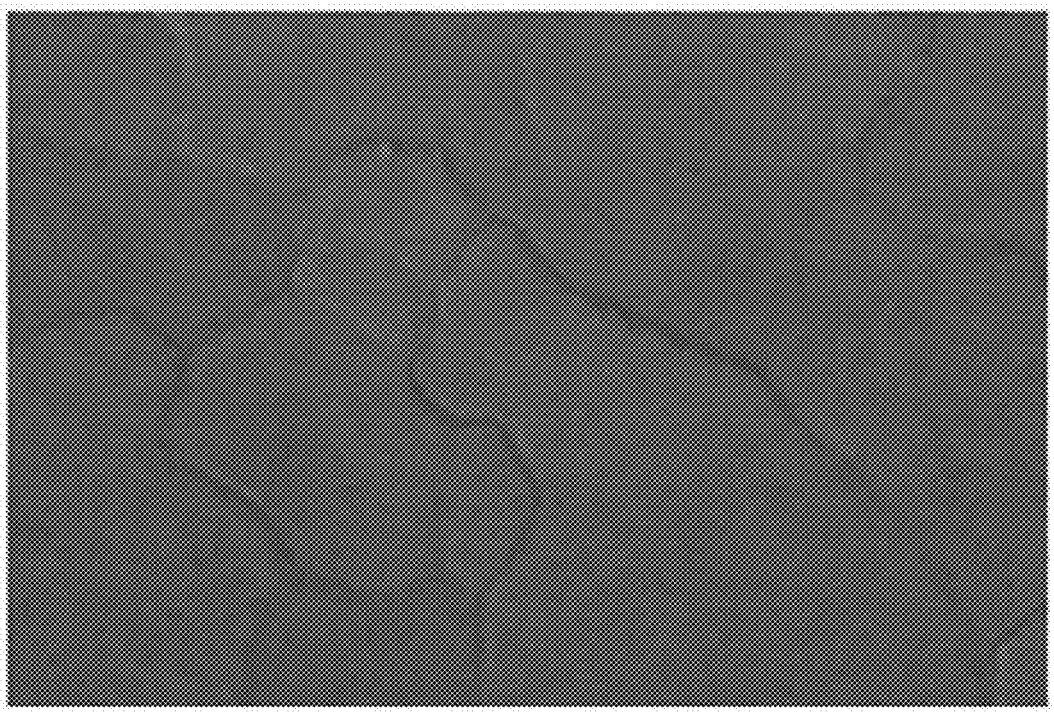
FIG. 7 is an image illustrating surface defects of a scandium-containing aluminum alloy (0.625 at %).
Figure 8:
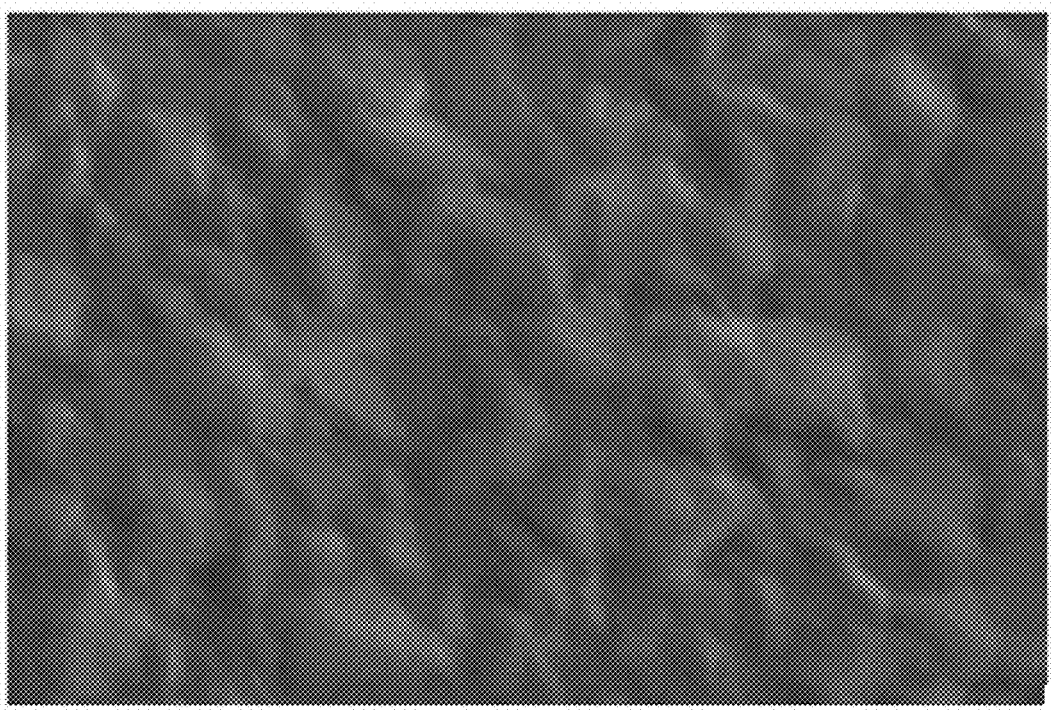
FIG. 8 is an image illustrating surface defects of a scandium-containing aluminum alloy (6.25 at %).

For example, as illustrated in FIGS. 6 to 8, surface defects of a groove are observed in pure aluminum (Al), while the surface defects are not observed in the scandium-containing aluminum alloy (AlSc, 0.625 at %). In addition, when the content of scandium (Sc) is excessive, it can be seen that surface roughness is increased.

Figure 9:
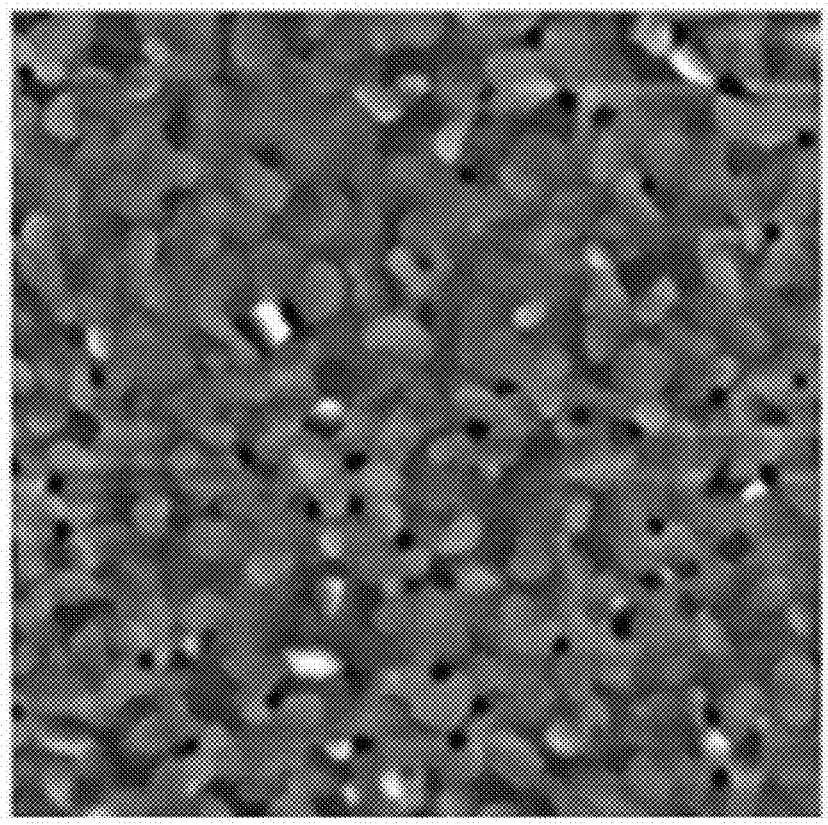
FIG. 9 is an image illustrating surface roughness of pure aluminum captured using atomic force microscopy.
Figure 10:
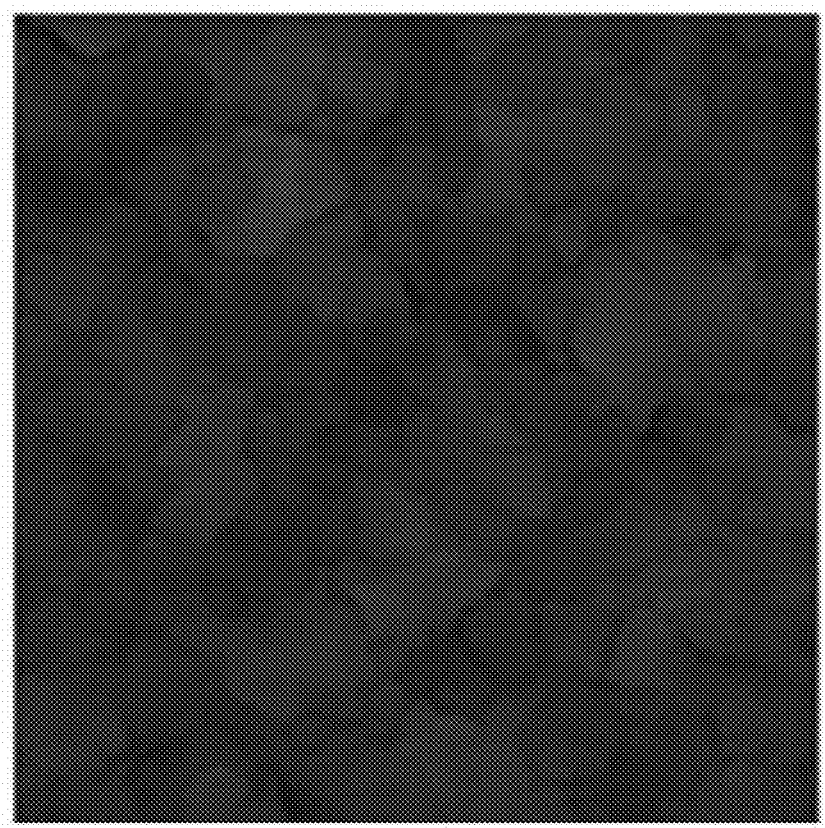
FIG. 10 is an image illustrating surface roughness of a scandium-containing aluminum alloy (0.625 at %) captured using atomic force microscopy.
Figure 11:
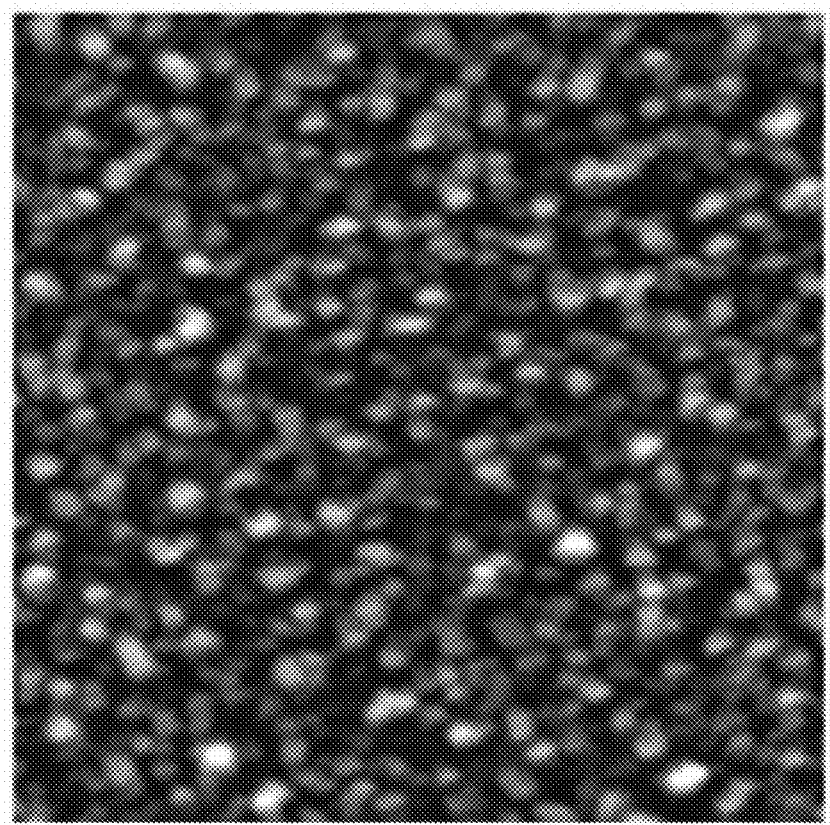
FIG. 11 is an image illustrating surface roughness of a scandium-containing aluminum alloy (6.25 at %) captured using atomic force microscopy.

More specifically, a surface roughness of samples in which pure aluminum (Al) (FIG. 6), aluminum alloy (AlSc) containing scandium (Sc) of 0.625 at % (FIG. 7), and aluminum alloy (AlSc) containing scandium (Sc) of 6.25 at % (FIG. 8) were deposited was measured captured using atomic force microscopy (AFM). As illustrated in FIGS. 9 to 11, pure aluminum (Al) had a surface roughness of 3.74 nm based on a scan size (10 μm×10 μm), a scandium-containing aluminum alloy (AlSc) of 0.625 at % had a surface roughness of 1.70 nm based on a scan size (10 μm×10 μm), and aluminum alloy (AlSc) containing scandium (Sc) of 6.25 at % had surface roughness (Ra) increased to 10.27 nm based on a scan size of (10 μm×10 μm).

An aluminum alloy (AlSc) containing pure aluminum (Al) and scandium (Sc) may have an FCC crystal structure. When the aluminum alloy is oriented in a (111) crystal surface, it has lattice mismatch of 8% with a (0002) crystal surface of an HCP crystal structure of aluminum nitride (AlN), which forms the piezoelectric layer 160. The bottom electrode 150 formed of the aluminum alloy (AlSc) containing pure aluminum (Al) and scandium (Sc) has an improved lattice mismatch with aluminum nitride (AlN), as compared to the lattice mismatch of 14% in a case in which a bottom electrode is formed of molybdenum (Mo).

However, in the case of the pure aluminum (Al), when surface roughness is increased, crystal orientation of the piezoelectric layer 160 may be deteriorated due to surface defects, and the like.

After aluminum alloy (AlSc), containing pure aluminum (Al) and scandium (Sc), and molybdenum (Mo) were each deposited to have a thickness of 1,500 Å on a seed layer having the thickness of 500 Å, aluminum nitride (AlN), forming the piezoelectric layer 160, was deposited to have a thickness of 5,000 Å. An XRD rocking curve was measured to compare crystal orientations of thin films. The crystal orientations are illustrated in Table (2) below.

TABLE (2)

| FWHM (degree) | Mo | Pure Al | Sc-containing Al Alloy (AlSc 6.25 at %) | Sc-containing Al Alloy (AlSc 0.625 at %) |
|---|---|---|---|---|
| Crystal Orientation of Bottom Electrode (1,500 Å) | 2.77° (110) | 1.31° (111) | 1.13° (111) | 0.49° (111) |
| Crystal Orientation of Piezoelectric Layer (5,000 Å) | 1.95° (0002) | 1.73° (0002) | 2.19° (0002) | 0.78° (0002) |

Figure 12:
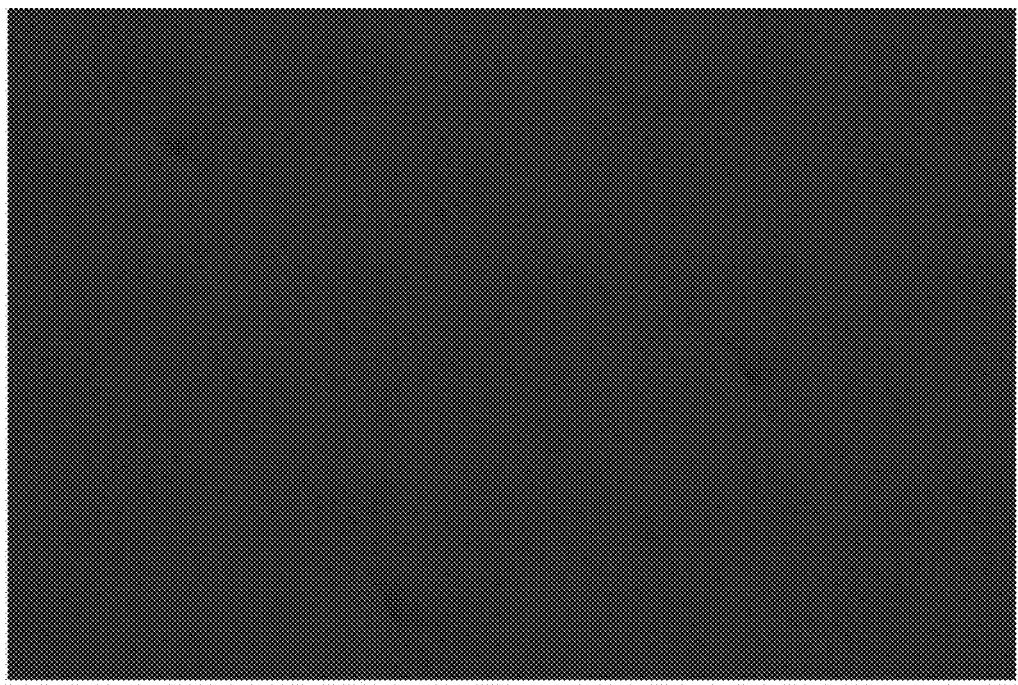
FIG. 12 is an image illustrating surface defects of a piezoelectric layer formed on pure aluminum.
Figure 13:
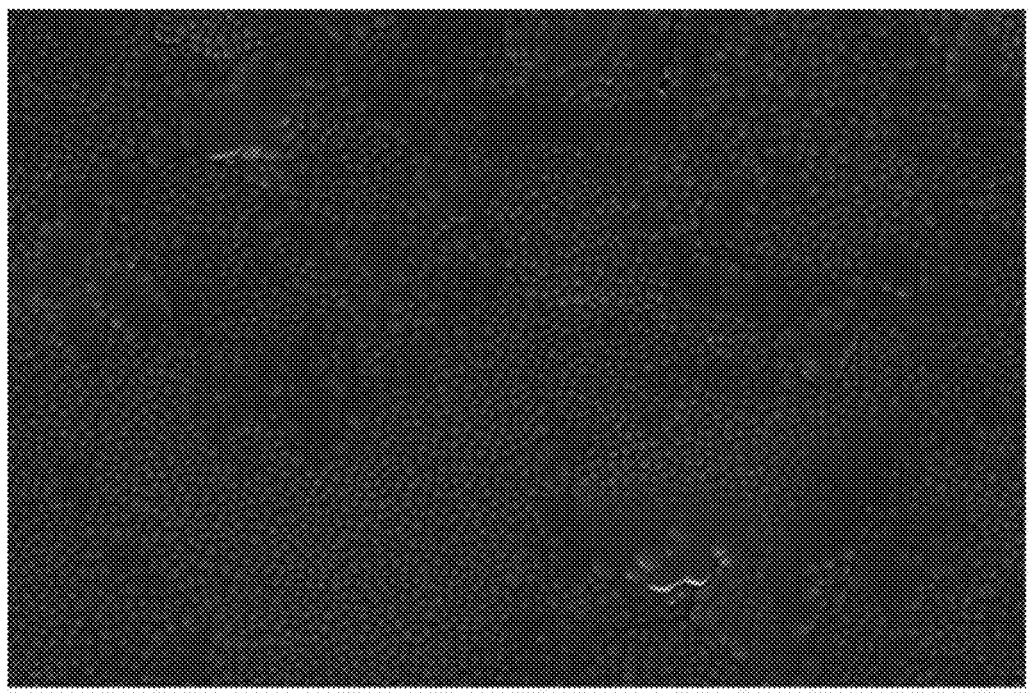
FIG. 13 is an image illustrating surface defects of a piezoelectric layer formed on a scandium-containing aluminum alloy (6.25 at %).
Figure 14:
FIG. 14 is an image illustrating surface defects of a piezoelectric layer formed on a scandium-containing aluminum alloy (0.625 at %).

For example, in the case in which aluminum nitride (AlN) was deposited on molybdenum (Mo), the crystal orientation of aluminum nitride (AlN) was 1.95 degrees. In the case in which aluminum nitride (AlN) was deposited on pure aluminum (Al), crystal orientation was 1.73 degrees due to surface defects of the pure aluminum (Al). In other words, crystal orientation of the piezoelectric layer deposited on pure aluminum (Al) was improved as compared to the case in which the piezoelectric layer was deposited on molybdenum (Mo), but the surface defects of the groove, observed on the surface of pure aluminum (Al), are transferred as it is, even in the case in which aluminum nitride (AlN) is deposited as illustrated in FIG. 12. In addition, crystal orientation of the piezoelectric layer deposited on aluminum alloy (AlSc), containing scandium of 6.25 at %, was deteriorated to 2.19 degrees (see Table (2)) as compared to the piezoelectric layer deposited on pure aluminum (Al), due to an increase in surface roughness when aluminum nitride (AlN) is deposited, as illustrated in FIG. 13. However, aluminum nitride (AlN) deposited on aluminum alloy (AlSc), containing scandium (Sc) of 0.625 at %, exhibited a most improved crystal orientation of 0.78 degrees (see Table (2)), as illustrated in FIG. 14.

In other words, when the bottom electrode 150 is formed of the aluminum alloy (AlSc) containing scandium (Sc) of 0.625 at %, the piezoelectric layer 160 may be more stably deposited during the sputtering process to improve crystal orientation, and chemical resistance may be improved to secure manufacturing stability.

Figure 15:
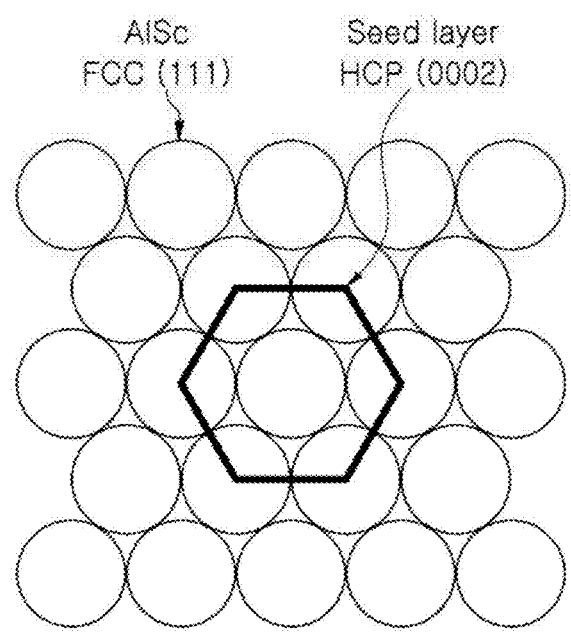
FIG. 15 is a schematic diagram illustrating a lattice structure of a seed layer and an AlSc bottom electrode.

Hereinafter, an effect obtained from the seed layer 151 having a hexagonal crystal structure will be described. As described above, the seed layer 151 may be formed of a metal such as titanium (Ti) or ruthenium (Ru), having a hexagonal system structure, to reduce lattice mismatch with the bottom electrode 150, the piezoelectric layer 160, and the like disposed thereon. FIG. 15 is a schematic diagram illustrating a lattice structure of a seed layer and an AlSc bottom electrode. The seed layer has an HCP crystal structure, and the AlSc bottom electrode has an FCC crystal structure. As illustrated in Table (3) below, in the case in which Ti and Ru are used as the seed layer, lattice mismatch of the bottom electrode 150 is addressed, as compared to a case in which AlN is used as the seed layer. As a result, it can be seen that the crystal orientation of the piezoelectric layer 160 and sheet resistance of the bottom electrode 150 are significantly improved. In this case, the seed layer was formed to have a thickness of 500 Å, the bottom electrode was formed of AlSc, and the piezoelectric layer was formed of AlN.

TABLE (3)

| Seed Layer | Lattice Mismatch with Bottom Electrode (%) | Crystal Orientation of Bottom Electrode (1,500 Å) | Crystal Orientation of Piezoelectric layer (5,000 Å) | Sheet Resistance of Bottom Electrode (ohm/sq) |
|---|---|---|---|---|
| AlN (Ref.) | 8.80 | 0.51 | 0.81 | 0.314 |
| Ti | 3.01 | 0.17 | 0.27 | 0.275 |
| Ru | 5.70 | 0.33 | 0.52 | 0.220 |

A result of Table (3) will be described in detail. When a seed layer changes from AlN to Ti having a hexagonal crystal structure, the lattice mismatch with the AlSc bottom electrode is improved from 8.8% to 3.01%. Accordingly, it can be seen that crystal orientation of the AlSc bottom electrode is improved and piezoelectric orientation of AlN is ultimately improved rapidly. It can be seen that an improvement in crystal orientation of a Ru seed layer is lower than an improvement in crystal orientation of a Ti seed layer, as compared to an AlN seed layer, but sheet resistance of the AlSc bottom electrode is significantly improved. In other words, it can be seen that the AlSc bottom electrode has sheet resistance of about 0.314 ohm/sq when an existing AlN seed layer having a thickness of 500 Å is applied, but has sheet resistance of 0.275 ohm/sq when the Ti seed layer is applied, and has sheet resistance of 0.220 ohm/sq when the Ru seed layer is applied. As described above, in the case in which an ultra-thin film is required like a resonator of a sub-6 GHz frequency band, when Ti and Ru seed layers are used, crystal orientation of a piezoelectric layer may be improved and electrical resistance of the AlSc bottom electrode may be improved.

Hereinafter, modified example embodiments of a bulk-acoustic wave resonator will be described with reference to the drawings, and descriptions below will focus on features different from those of the embodiment of FIGS. 1 to 4. For example, all the following embodiments employ a seed layer having a hexagonal crystal structure, and such a seed layer may include Ti, Ru, and the like.

Figure 16:
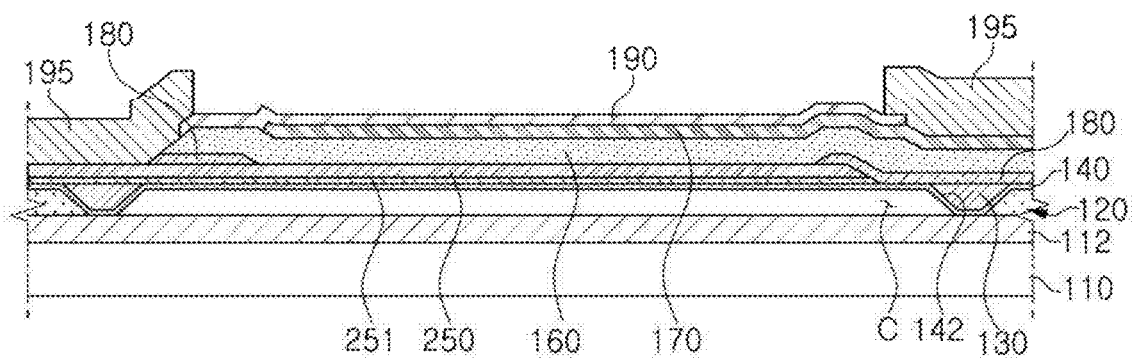
FIG. 16 is a schematic cross-sectional view of a bulk-acoustic wave resonator, according to another embodiment.

FIG. 16 is a schematic cross-sectional view of a bulk-acoustic wave resonator 200, according to another embodiment.

Referring to FIG. 16, the bulk-acoustic wave resonator 200 may include the substrate 110, the sacrificial layer 120, the etch stop portion 130, the membrane layer 140, a seed layer 251, a bottom electrode 250, the piezoelectric layer 160, the top electrode 170, the insertion layer 180, the passivation layer 190, and the metal pad 195.

The bottom electrode 250 may be disposed on the membrane layer 140, and a portion of the bottom electrode 250 may be disposed on the cavity C. The bottom electrode 250 may be used as either one of an input electrode and an output electrode inputting and outputting, respectively, an electrical signal such as a radio-frequency (RF) signal or the like.

As an example, the bottom electrode 250 may be formed of a conductive material such as molybdenum (Mo) or an alloy thereof. However, the material of the bottom electrode 250 is not limited to these examples, and the bottom electrode 250 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Since the top electrode 170 is formed of a scandium-containing aluminum alloy, chemical resistance may be increased. For example, issues, caused when the top electrode is formed of pure aluminum, may be addressed. Moreover, during a manufacturing process, stability of a process such as dry etching or wet etching may be secured. Furthermore, in the case in which the bottom electrode is formed of pure aluminum, oxidation may be easily caused, but since the top electrode 170 is formed of a scandium-containing aluminum alloy, chemical resistance against oxidation may be increased.

Figure 17:
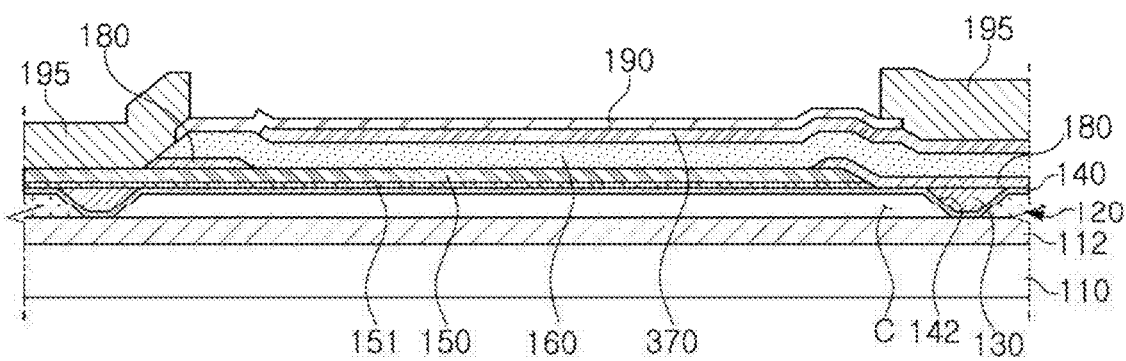
FIG. 17 is a schematic cross-sectional view of a bulk-acoustic wave resonator, according to another embodiment.

FIG. 17 is a schematic cross-sectional view of a bulk-acoustic wave resonator 300, according to another embodiment.

Referring to FIG. 17, the bulk acoustic wave resonator 300 may include the substrate 110, the sacrificial layer 120, the etch stop portion 130, the membrane layer 140, the seed layer 151, the bottom electrode 150, the piezoelectric layer 160, a top electrode 370, the insertion layer 180, the passivation layer 190, and the metal pad 195.

The top electrode 370 may be disposed to cover at least a portion of the piezoelectric layer 160 disposed on the cavity C. The top electrode 370 may be used as either one of an input electrode and an output electrode inputting and outputting, respectively, an electrical signal such as a radio-frequency (RF) signal, or the like. For example, in a case in which the bottom electrode 150 is used as an input electrode, the top electrode 370 may be used as an output electrode. In a case in which the bottom electrode 150 is used as an output electrode, the top electrode 370 may be used as an input electrode.

The top electrode 370 may be formed of a conductive material such as molybdenum (Mo) or an alloy thereof. However, the material of the top electrode 370 is not limited to these examples, and the top electrode 370 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Similarly to the bottom electrode 150 included in the above-described bulk-acoustic resonator 100 (FIGS. 1 to 4), the bottom electrode 150 is formed of a scandium-containing aluminum alloy. As such, the bottom electrode 150 may be formed of the scandium-containing aluminum alloy (Sc), such that high power reactive sputtering may be performed as mechanical strength is increased. Under such a deposition condition, surface roughness of the bottom electrode 150 may be prevented from increasing and high orientation growth of the piezoelectric layer 160 may also be induced.

Since scandium (Sc) is included in the bottom electrode 150, chemical resistance of the bottom electrode 150 may be increased to address issues caused when a bottom electrode is formed of pure aluminum. Moreover, during the manufacturing process, stability of a process such as dry etching or wet etching may be secured. Furthermore, in a case in which a bottom electrode is formed of pure aluminum, oxidation is easily caused, but since the bottom electrode 150 is formed of the scandium-containing aluminum alloy, chemical resistance against oxidation may be increased.

Figure 18:
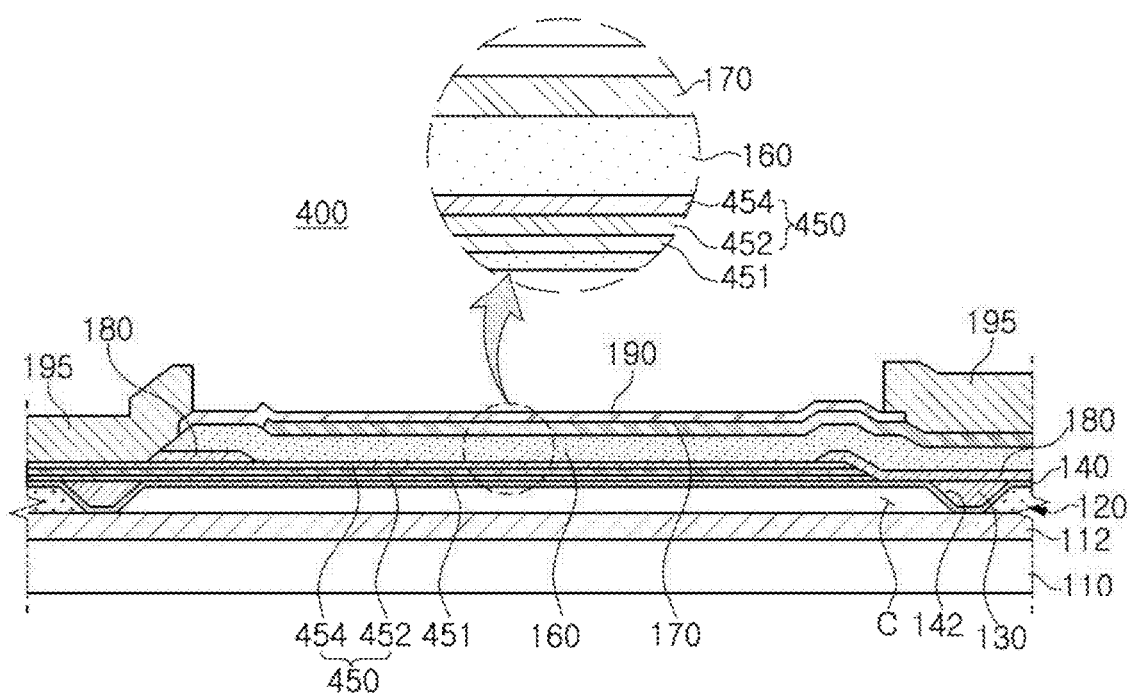
FIG. 18 is a schematic cross-sectional view of a bulk-acoustic wave resonator, according to another embodiment.

FIG. 18 is a schematic cross-sectional view of a bulk-acoustic wave resonator 400, according to another embodiment.

Referring to FIG. 18, the bulk-acoustic wave resonator 400 may include the substrate 110, the sacrificial layer 120, the etch stop portion 130, the membrane layer 140, a seed layer 451, a bottom electrode 450, the piezoelectric layer 160, the top electrode 170, the insertion layer 180, the passivation layer 190, and the metal pad 195.

The bottom electrode 450 may be disposed on the membrane layer 140, and a portion of the bottom electrode 450 may be disposed on the cavity C. The bottom electrode 450 may be used as either one of an input electrode and an output electrode inputting and outputting, respectively, an electrical signal such as a radio-frequency (RF) signal or the like.

As an example, the bottom electrode 450 may include a first bottom electrode layer 452, formed of a scandium-containing aluminum alloy, and a second bottom electrode layer 454 disposed on the first bottom electrode layer 452.

The second bottom electrode layer 454 may be formed of a conductive material such as molybdenum (Mo) or an alloy thereof. However, the material of the second bottom electrode layer 454 is not limited to these examples, and the second bottom electrode layer 454 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

As described above, since the top electrode 170 and the first bottom electrode layer 452 are formed of the scandium-containing aluminum alloy, chemical resistance may be increased to address issues caused when a bottom electrode and a top electrode are formed of pure aluminum. Moreover, during a manufacturing process, stability of a process such as dry etching or wet etching may be secured. Furthermore, in the case in which a bottom electrode and a top electrode are formed of pure aluminum, oxidation is easily caused, but since the top electrode 170 and bottom electrode 450 are formed of the scandium-containing aluminum alloy, chemical resistance against oxidation may be increased.

Figure 19:
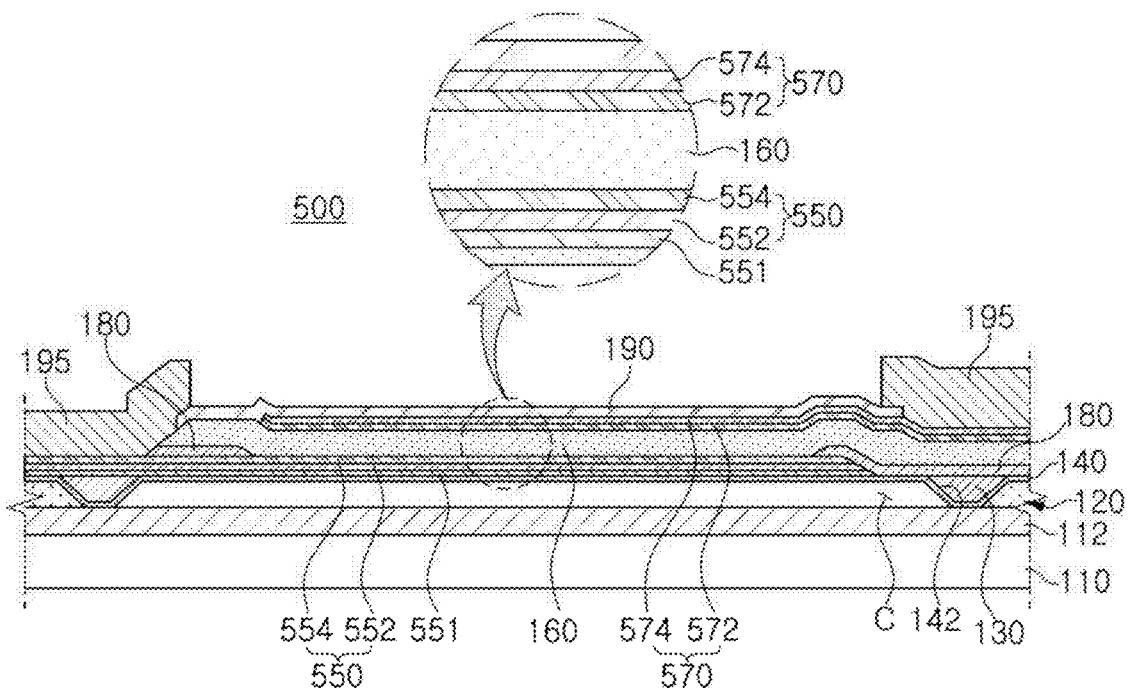
FIG. 19 is a schematic cross-sectional view of a bulk-acoustic wave resonator, according to another embodiment.

FIG. 19 is a schematic cross-sectional view of a bulk-acoustic wave resonator 500, according to another embodiment.

Referring to FIG. 19, the bulk-acoustic wave resonator 500 may include the substrate 110, the sacrificial layer 120, the etch stop portion 130, the membrane layer 140, a seed layer 551, a bottom electrode 550, a piezoelectric layer 160, a top electrode 570, the insertion layer 180, the passivation layer 190, and the metal pad 195.

The bottom electrode 550 may be disposed on the membrane layer 140, and a portion of the bottom electrode 550 may be disposed on the cavity C. The bottom electrode 550 may be used as either one of an input electrode and an output electrode inputting and outputting, respectively, an electrical signal such as a radio-frequency (RF) signal or the like.

As an example, the bottom electrode 550 may include a first bottom electrode layer 552 and a second bottom electrode layer 554 disposed on the first bottom electrode layer 552 and formed of a scandium-containing aluminum alloy.

The first bottom electrode layer 552 may be formed of a conductive material such as molybdenum (Mo) or an alloy thereof. However, the material of the first bottom electrode layer 552 is not limited these examples, and the first bottom electrode layer 552 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The top electrode 570 may be formed to cover at least a portion of the piezoelectric layer 160 disposed on the cavity C. The top electrode 570 may be used as either one of an input electrode and an output electrode inputting and outputting, respectively, an electrical signal such as a radio-frequency (RF) signal, or the like. For example, in a case in which the bottom electrode 550 is used as an input electrode, the top electrode 570 may be used as an output electrode. In a case in which the bottom electrode 550 is used as an output electrode, the top electrode 570 may be used as an input electrode.

The top electrode 570 may include a first top electrode layer 572, formed of a scandium-containing aluminum alloy, and a second top electrode layer 574 disposed on the first top electrode layer 572.

The second top electrode layer 574 may be formed of a conductive material such as molybdenum (Mo) or an alloy thereof. However, the material of the second top electrode layer 574 is not limited to these examples, and the second top electrode layer 574 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

As described above, the second bottom electrode layer 554 is formed of the scandium-containing aluminum alloy. As such, the second bottom electrode 554 may be formed of the scandium-containing aluminum alloy (Sc), such that high power reactive sputtering may be performed as mechanical strength is increased. Under such a deposition condition, surface roughness of the second bottom electrode 554 may be prevented from increasing and high orientation growth of the piezoelectric layer 160 may also be induced.

Since the second bottom electrode layer 554 and the first top electrode layer 572 are formed of the scandium-containing aluminum alloy, chemical resistance may be increased to address issues caused when the bottom electrode and the top electrode are formed of pure aluminum. Moreover, during a manufacturing process, stability of a process such as dry etching or wet etching may be secured. Furthermore, in the case in which the bottom electrode and the top electrode are formed of pure aluminum, oxidation is easily caused, but since the second bottom electrode layer 554 and the first top electrode layer 572 are formed of the scandium-containing aluminum alloy, chemical resistance against oxidation may be improved.

Figure 20:
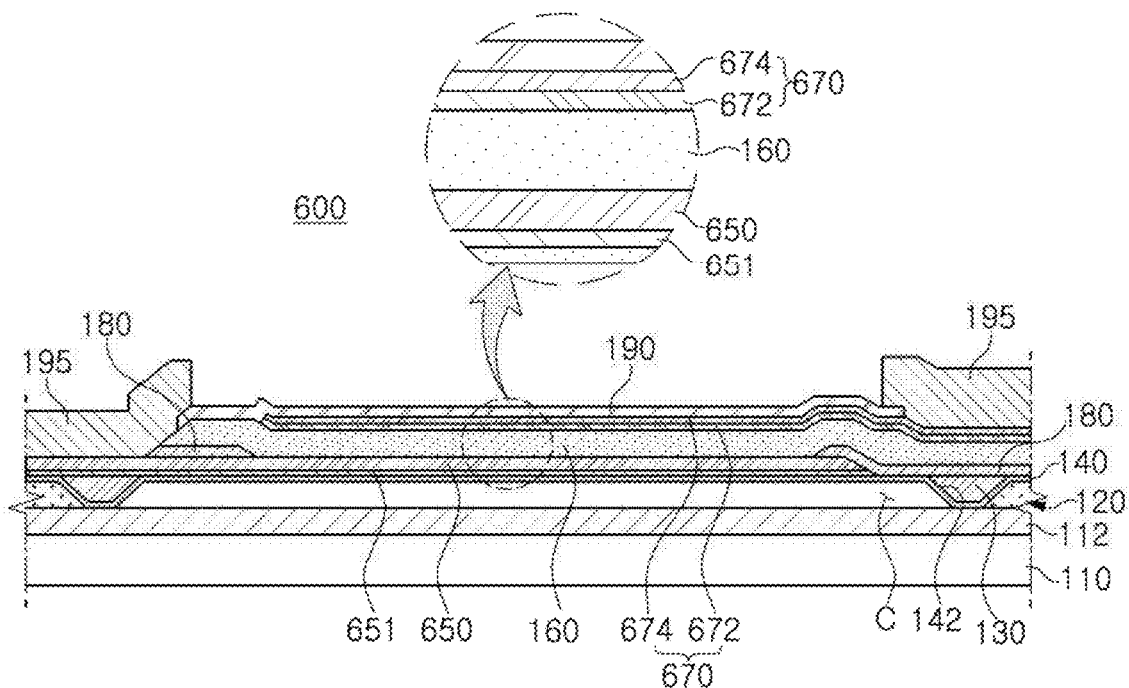
FIG. 20 is a schematic cross-sectional view of a bulk-acoustic wave resonator, according to another embodiment.

FIG. 20 is a schematic cross-sectional view of a bulk-acoustic wave resonator 600, according to another embodiment.

Referring to FIG. 20, the bulk-acoustic wave resonator 600 may include the substrate 110, the sacrificial layer 120, the etch stop portion 130, the membrane layer 140, a seed layer 651, a bottom electrode 650, the piezoelectric layer 160, a top electrode 670, the insertion layer 180, the passivation layer 190, and the metal pad 195.

The bottom electrode 650 may be disposed on the membrane layer 140, and a portion of the bottom electrode 650 may be disposed on the cavity C. The bottom electrode 650 may be used as either one of an input electrode and an output electrode inputting and outputting, respectively, an electrical signal such as a radio-frequency (RF) signal or the like.

The bottom electrode 650 may be formed of a conductive material such as molybdenum (Mo) or an alloy thereof. However, the material of the bottom electrode 650 is not limited these examples, and the bottom electrode 650 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The top electrode 670 may be disposed to cover at least a portion of the piezoelectric layer 160 disposed on the cavity C. The top electrode 670 may be used as either one of an input electrode and an output electrode inputting and outputting, respectively, an electrical signal such as a radio-frequency (RF) signal, or the like. For example, in a case in which the bottom electrode 650 is used as an input electrode, the top electrode 670 may be used as an output electrode. In a case in which the bottom electrode 650 is used as an output electrode, the top electrode 670 may be used as an input electrode.

The top electrode 670 may include a first top electrode layer 672, formed of a scandium-containing aluminum alloy, and a second top electrode layer 674 formed on the first top electrode layer 672.

The second top electrode layer 674 may be formed of a conductive material such as molybdenum (Mo) or an alloy thereof. However, the material of the second top electrode layer 674 is not limited to these examples, and the second top electrode layer 674 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Since the first top electrode layer 672 is formed of the scandium-containing aluminum alloy, chemical resistance may increased to address issues caused when the bottom electrode and the top electrode are formed of pure aluminum. Moreover, during the manufacturing process, stability of a process such as dry etching or wet etching may be provided. Furthermore, in the case in which a bottom electrode and a top electrode are formed of pure aluminum, oxidation is easily caused, but the first top electrode layer 672 formed of the scandium-containing aluminum alloy may be provided to improve chemical resistance against oxidation.

Figure 21:
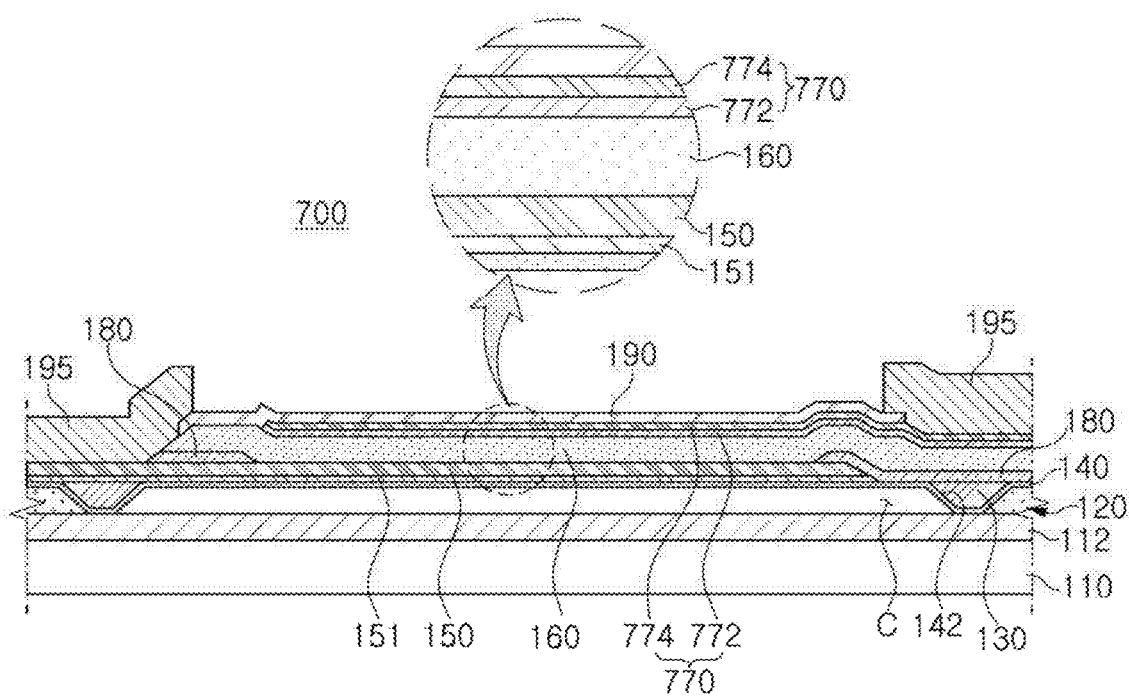
FIG. 21 is a schematic cross-sectional view of a bulk-acoustic wave resonator, according to another embodiment.

FIG. 21 s a schematic cross-sectional view of a bulk-acoustic wave resonator 700, according to another embodiment.

Referring to FIG. 21, the bulk-acoustic wave resonator 700 may include the substrate 110, the sacrificial layer 120, the etch stop portion 130, the membrane layer 140, the seed layer 151, the bottom electrode 150, the piezoelectric layer 160, a top electrode 770, the insertion layer 180, the passivation layer 190, and the metal pad 195.

The top electrode 770 may be disposed to cover at least a portion of the piezoelectric layer 160 disposed on the cavity C. The top electrode 770 may be used as either one of an input electrode and an output electrode inputting and outputting, respectively, an electrical signal such as a radio-frequency (RF) signal, or the like. For example, in a case in which the bottom electrode 150 is used as an input electrode, the top electrode 770 may be used as an output electrode. In a case in which the bottom electrode 150 is used as an output electrode, the top electrode 770 may be used as an input electrode.

The top electrode 770 may include a first top electrode layer 772 and a second top electrode layer 774 disposed on the first top electrode layer 772 and formed of a scandium-containing aluminum alloy.

The first top electrode layer 772 may be formed of a conductive material such as molybdenum (Mo) or an alloy thereof. However, the material of the first top electrode layer 772 is not limited to these examples, and the first top electrode layer 772 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Figure 22:
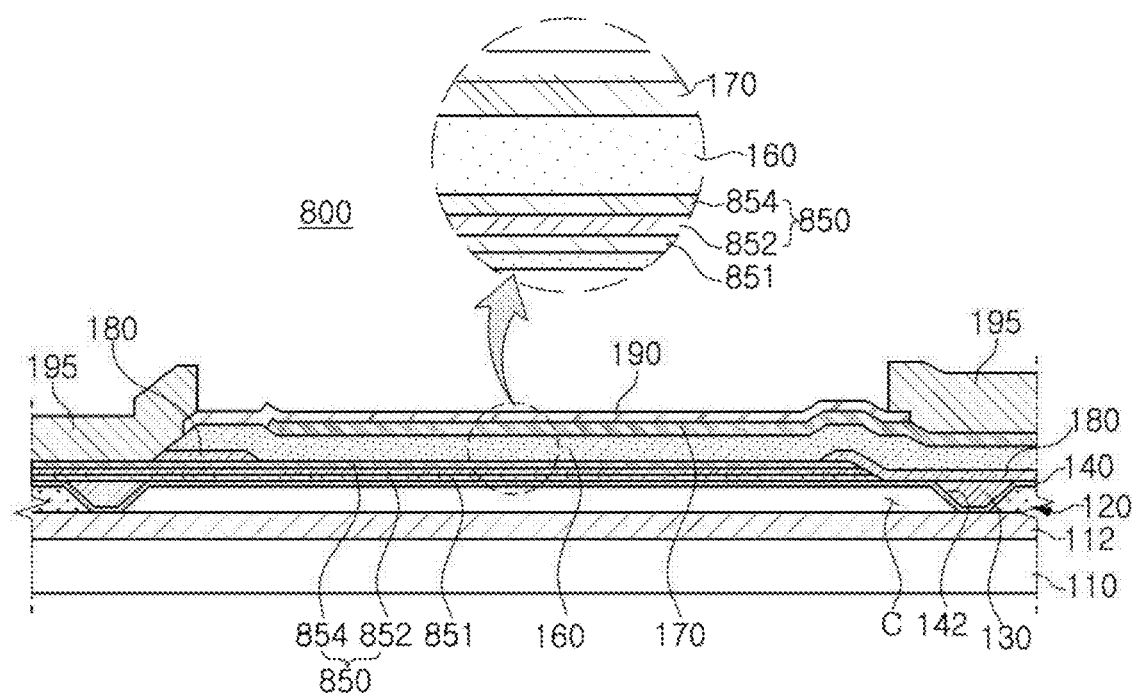
FIG. 22 is a schematic cross-sectional view of a bulk-acoustic wave resonator, according to another embodiment.

FIG. 22 is a schematic cross-sectional view of a bulk-acoustic wave resonator 800, according to another embodiment.

Referring to FIG. 22, the bulk-acoustic wave resonator 800 may include the substrate 110, the sacrificial layer 120, the etch stop portion 130, the membrane layer 140, a seed layer 851, a bottom electrode 850, the piezoelectric layer 160, the top electrode 170, the insertion layer 180, the passivation layer 190, and the metal pad 195.

The bottom electrode 850 may be formed on the membrane layer 140, and a portion of the bottom electrode 850 may be disposed on the cavity C. In addition, the bottom electrode 850 may be used as either one of an input electrode and an output electrode inputting or outputting, respectively, an electrical signal such as a radio frequency (RF) signal or the like.

As an example, the bottom electrode 850 may include a first bottom electrode layer 852 and a second bottom electrode layer 854 formed on the first bottom electrode layer 852 and formed of a scandium-containing aluminum alloy.

The first bottom electrode layer 852 may be formed of a conductive material such as molybdenum (Mo) or an alloy thereof. However, the material of the first bottom electrode layer 852 is not limited to these examples, and the first bottom electrode layer 852 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Figure 23:
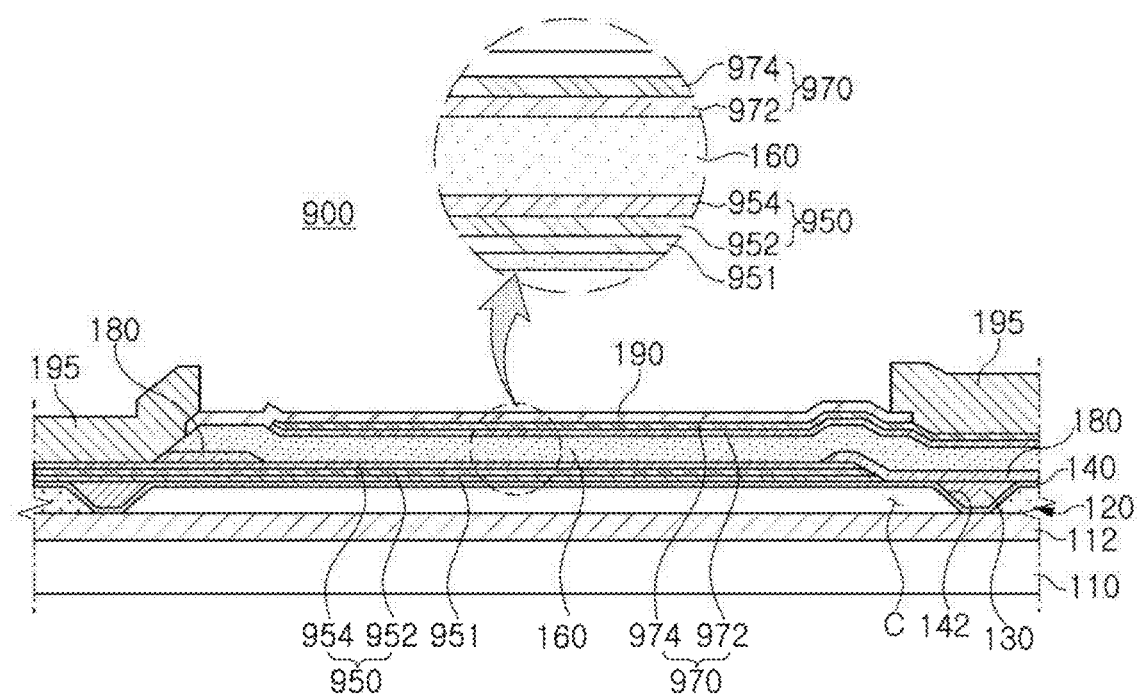
FIG. 23 is a schematic cross-sectional view of a bulk-acoustic wave resonator, according to another embodiment.

FIG. 23 is a schematic cross-sectional view of a bulk-acoustic wave resonator 900, according to another embodiment.

Referring to FIG. 23, the bulk-acoustic wave resonator 900 may include the substrate 110, the sacrificial layer 120, the etch stop portion 130, the membrane layer 140, a seed layer 951, a bottom electrode 950, the piezoelectric layer 160, a top electrode 970, the insertion layer 180, the passivation layer 190, and the metal pad 195.

The bottom electrode 950 may be disposed on the membrane layer 140, and a portion of the bottom electrode 950 may be disposed on the cavity C. The bottom electrode 950 may be used as either one of an input electrode and an output electrode inputting and outputting, respectively, an electrical signal such as a radio-frequency (RF) signal or the like.

As an example, the bottom electrode 950 may include a first bottom electrode layer 952, formed of a scandium-containing aluminum alloy, and a second bottom electrode layer 952 disposed on the first bottom electrode layer 954.

The second bottom electrode layer 954 may be formed of a conductive material such as molybdenum (Mo) or an alloy thereof. However, the material of the second bottom electrode layer 954 is not limited to these examples, and the second bottom electrode layer 954 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The top electrode 970 may be formed to cover at least a portion of the piezoelectric layer 160 disposed on the cavity C. The top electrode 970 may be used as either one of an input electrode and an output electrode inputting and outputting, respectively, an electrical signal such as a radio-frequency (RF) signal, or the like. For example, in a case in which the bottom electrode 950 is used as an input electrode, the top electrode 970 may be used as an output electrode. In a case in which the bottom electrode 950 is used as an output electrode, the top electrode 970 may be used as an input electrode.

The top electrode 970 may include a first top electrode layer 972 and a second top electrode layer 974 disposed on the first top electrode layer 972 and formed of a scandium-containing aluminum alloy.

The first top electrode layer 972 may be formed of a conductive material such as molybdenum (Mo) or an alloy thereof. However, the material of the first top electrode layer 972 is not limited to these examples, and the first top electrode layer 972 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Figure 24:
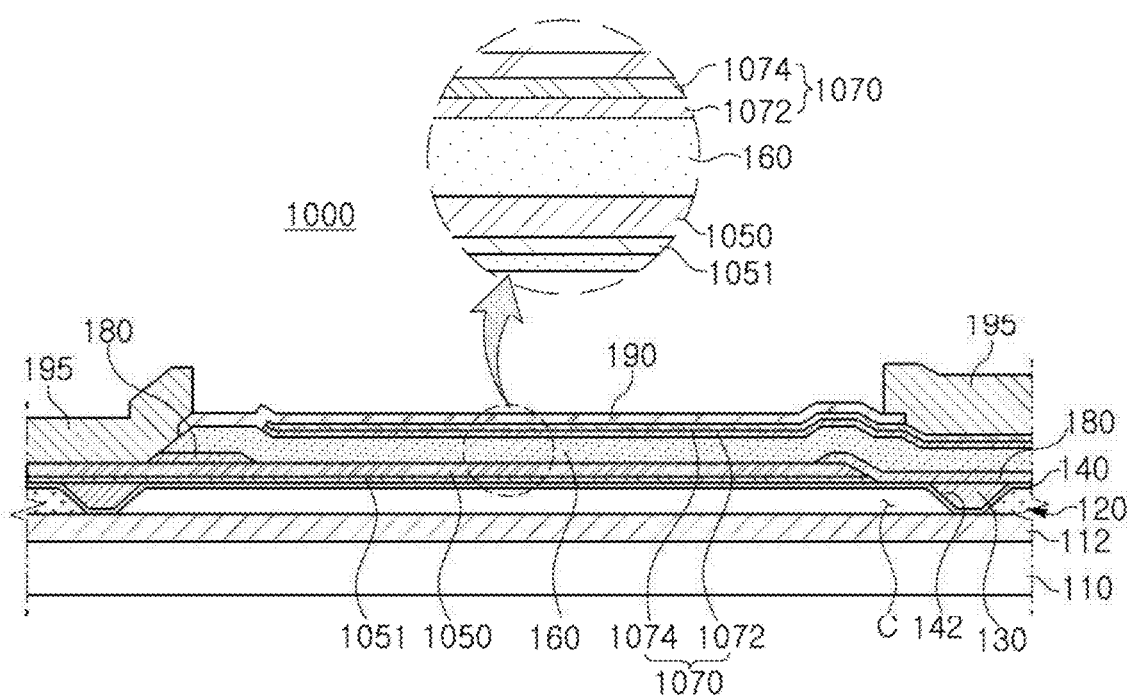
FIG. 24 is a schematic cross-sectional view of a bulk-acoustic wave resonator, according to another embodiment.

FIG. 24 is a schematic cross-sectional view of a bulk-acoustic wave resonator 1000, according to another embodiment.

Referring to FIG. 24, the bulk-acoustic wave resonator 1000 may include the substrate 110, the sacrificial layer 120, the etch stop portion 130, the membrane layer 140, a seed layer 1051, a bottom electrode 1050, the piezoelectric layer 160, a top electrode 1070, the insertion layer 180, the passivation layer 190, and the metal pad 195.

The bottom electrode 1050 may be disposed on the membrane layer 140, and a portion of the bottom electrode 1050 may be disposed on the cavity C. The bottom electrode 1050 may be used as either one of an input electrode and an output electrode inputting and outputting, respectively, an electrical signal such as a radio-frequency (RF) signal or the like.

The bottom electrode 1050 may be formed of a conductive material such as molybdenum (Mo) or an alloy thereof. However, the material of the bottom electrode 1050 is not limited to these examples, and the bottom electrode 1050 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The top electrode 1070 may be formed to cover at least a portion of the piezoelectric layer 160 disposed on the cavity C. The top electrode 1070 may be used as either one of an input electrode and an output electrode inputting or outputting, respectively, an electrical signal such as a radio frequency (RF) signal, or the like. For example, in a case in which the bottom electrode 1050 is used as an input electrode, the top electrode 1070 may be used as an output electrode. In a case in which the bottom electrode 1050 is used as an output electrode, the top electrode 1070 may be used as an input electrode.

The top electrode 1070 may include a first top electrode layer 1072 and a second top electrode layer 1074 disposed on the first top electrode layer 1072 and formed of a scandium-containing aluminum alloy.

The first top electrode layer 1072 may be formed of a conductive material such as molybdenum (Mo) or an alloy thereof. However, the material of the first top electrode layer 1072 is not limited to these examples, and the first top electrode layer 1072 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Figure 25:
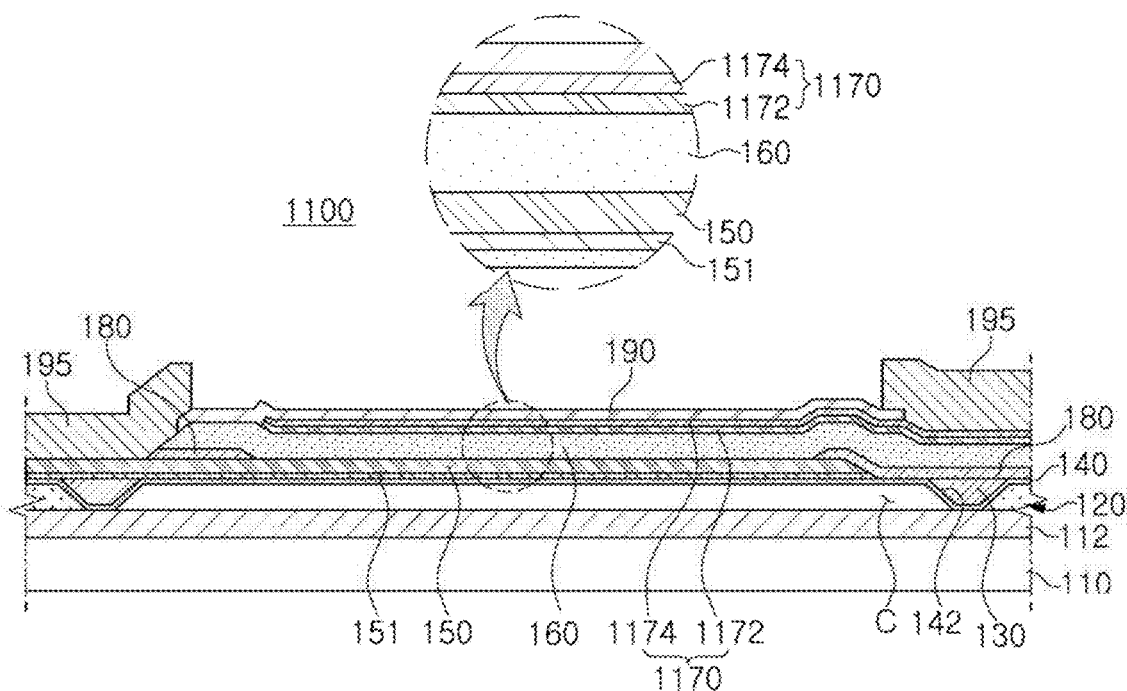
FIG. 25 is a schematic cross-sectional view of a bulk-acoustic wave resonator, according to another embodiment.

FIG. 25 is a schematic cross-sectional view of a bulk-acoustic wave resonator 1100, according to another embodiment.

Referring to FIG. 25, the bulk-acoustic wave resonator 1100 may include the substrate 110, the sacrificial layer 120, the etch stop portion 130, the membrane layer 140, the seed layer 151, the bottom electrode 150, the piezoelectric layer 160, a top electrode 1170, the insertion layer 180, the passivation layer 190, and the metal pad 195.

The top electrode 1170 may be formed to cover at least a portion of the piezoelectric layer 160 disposed on the cavity C. The top electrode 1170 may be used as either one of an input electrode and an output electrode inputting and outputting, respectively, an electrical signal such as a radio-frequency (RF) signal, or the like. For example, in a case in which the bottom electrode 150 is used as an input electrode, the top electrode 1170 may be used as an output electrode. In a case in which the bottom electrode 150 is used as an output electrode, the top electrode 1170 may be used as an input electrode.

The top electrode 1170 may include a first top electrode layer 1172, formed of a scandium-containing aluminum alloy, and a second top electrode layer 1174 disposed on the first top electrode layer 1172.

The second top electrode layer 1174 may be formed of a conductive material such as molybdenum (Mo) or an alloy thereof. However, the material of the second top electrode layer 1174 is not limited to these examples, and the second top electrode layer 1174 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Figure 26:
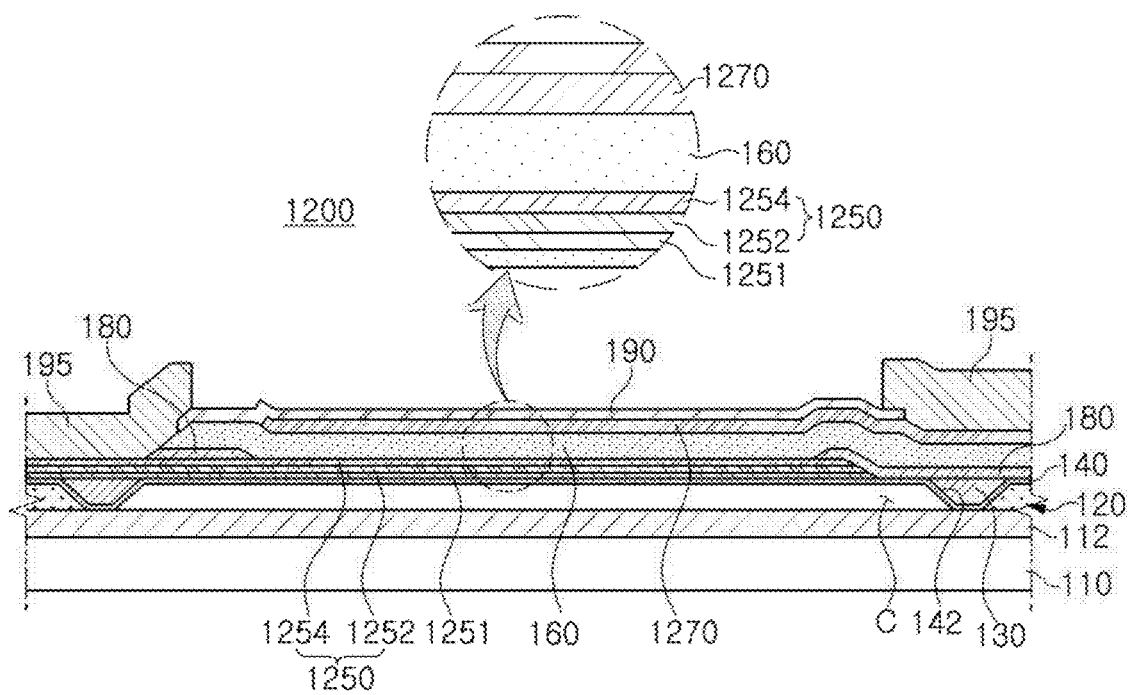
FIG. 26 is a schematic cross-sectional view of a bulk-acoustic wave resonator, according to another embodiment.

FIG. 26 is a schematic cross-sectional view of a bulk-acoustic wave resonator 1200, according to another embodiment.

Referring to FIG. 26, the bulk-acoustic wave resonator 1200 may include the substrate 110, the sacrificial layer 120, the etch stop portion 130, the membrane layer 140, a seed layer 1251, a bottom electrode 1250, the piezoelectric layer 160, a top electrode 1270, the insertion layer 180, the passivation layer 190, and the metal pad 195.

The bottom electrode 1250 may be disposed on the membrane layer 140, and a portion of the bottom electrode 1250 may be disposed on the cavity C. The bottom electrode 1250 may be used as either one of an input electrode and an output electrode inputting and outputting an electrical signal such as a radio-frequency (RF) signal or the like.

As an example, the bottom electrode 1250 may include a first bottom electrode layer 1252, formed of a scandium-containing aluminum alloy, and a second bottom electrode layer 1254 disposed on the first bottom electrode layer 1252.

The second bottom electrode layer 1254 may be formed of a conductive material such as molybdenum (Mo) or an alloy thereof. However, the material of the second bottom electrode layer 1254 is not limited to these examples, and the second bottom electrode layer 1254 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The top electrode 1270 may be formed to cover at least a portion of the piezoelectric layer 160 disposed on the cavity C. The top electrode 1270 may be used as either one of an input electrode and an output electrode inputting and outputting, respectively, an electrical signal such as a radio-frequency (RF) signal, or the like. For example, in a case in which the bottom electrode 1250 is used as an input electrode, the top electrode 1270 may be used as an output electrode. In a case in which the bottom electrode 1250 is used as an output electrode, the top electrode 1270 may be used as an input electrode.

As an example, the top electrode 1270 may be formed of a conductive material such as molybdenum (Mo) or an alloy thereof. However, the material of the top electrode 1270 is not limited to these examples, and the top electrode 1270 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Figure 27:
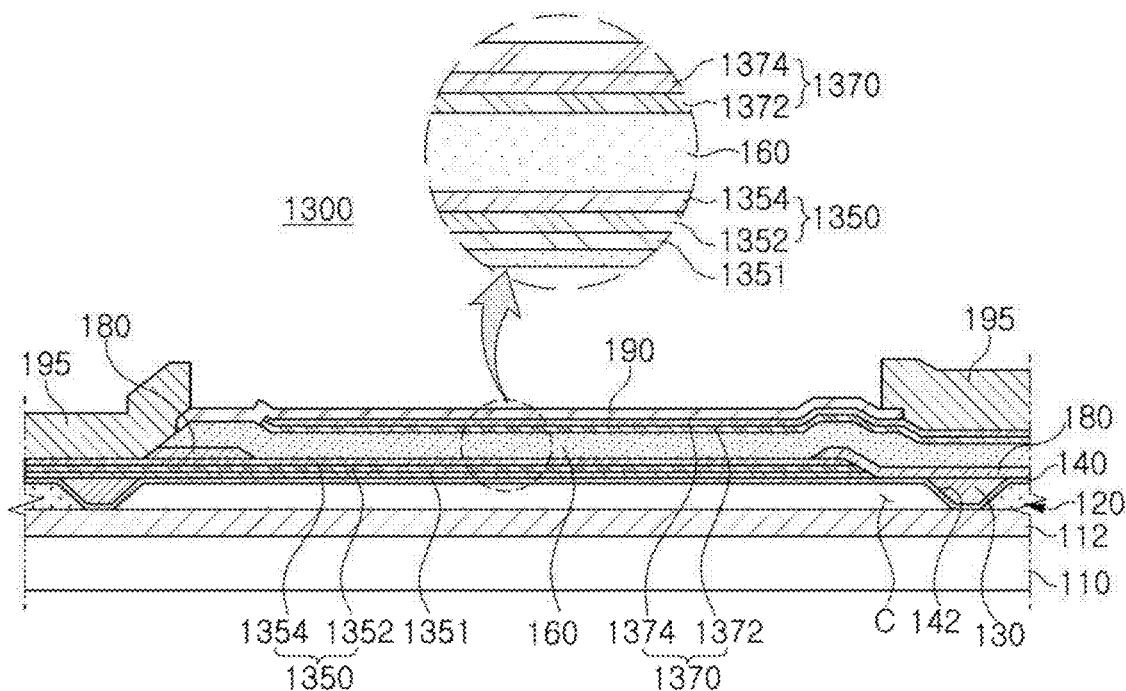
FIG. 27 is a schematic cross-sectional view of a bulk-acoustic wave resonator, according to another embodiment.

FIG. 27 is a schematic cross-sectional view of a bulk-acoustic wave resonator 1300, according to another embodiment.

Referring to FIG. 27, the bulk-acoustic wave resonator 1300 may include the substrate 110, the sacrificial layer 120, the etch stop portion 130, the membrane layer 140, a bottom electrode 1350, a seed layer 1351, the piezoelectric layer 160, a top electrode 1370, the insertion layer 180, the passivation layer 190, and the metal pad 195.

The bottom electrode 1350 may be disposed on the membrane layer 140, and a portion of the bottom electrode 1350 may be disposed on the cavity C. The bottom electrode 1350 may be used as either one of an input electrode and an output electrode inputting and outputting, respectively, an electrical signal such as a radio-frequency (RF) signal or the like.

As an example, the bottom electrode 1350 may include a first bottom electrode layer 1352, formed of a scandium-containing aluminum alloy, and a second bottom electrode layer 1354 formed on the first bottom electrode layer 1352.

The second bottom electrode layer 1354 may be formed of a conductive material such as molybdenum (Mo) or an alloy thereof. However, the material of the second bottom electrode layer 1354 is not limited to these examples, and the second bottom electrode layer 1354 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The top electrode 1370 may be disposed to cover at least a portion of the piezoelectric layer 160 disposed on the cavity C. The top electrode 1370 may be used as either one of an input electrode and an output electrode inputting and outputting, respectively, an electrical signal such as a radio-frequency (RF) signal, or the like. For example, in a case in which the bottom electrode 1350 is used as an input electrode, the top electrode 1370 may be used as an output electrode. In a case in which the bottom electrode 1350 is used as an output electrode, the top electrode 1370 may be used as an input electrode.

The top electrode 1370 may include a first top electrode layer 1372, formed of a scandium-containing aluminum alloy, and a second top electrode layer 1374 formed on the first top electrode layer 1372.

The second top electrode layer 1374 may be formed of a conductive material such as molybdenum (Mo) or an alloy thereof. However, the material of the second top electrode layer 1374 is not limited to these examples, and the second top electrode layer 1374 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Figure 28:
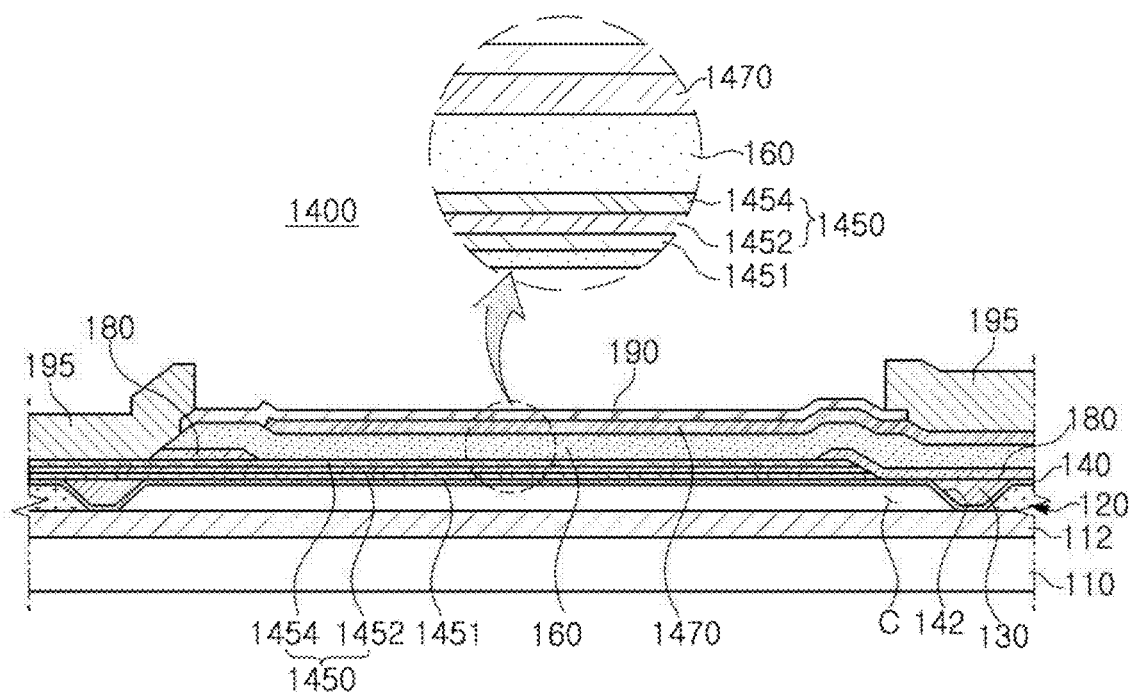
FIG. 28 is a schematic cross-sectional view of a bulk-acoustic wave resonator according to another embodiment.

FIG. 28 is a schematic cross-sectional view of a bulk-acoustic wave resonator 1400, according to another embodiment.

Referring to FIG. 28, the bulk acoustic wave resonator 1400 may include the substrate 110, the sacrificial layer 120, the etch stop portion 130, the membrane layer 140, a seed layer 1451, a bottom electrode 1450, the piezoelectric layer 160, a top electrode 1470, the insertion layer 180, the passivation layer 190, and the metal pad 195.

The bottom electrode 1450 may be disposed on the membrane layer 140, and a portion of the bottom electrode 1450 may be disposed on the cavity C. The bottom electrode 1450 may be used as either one of an input electrode and an output electrode inputting and outputting an electrical signal such as a radio-frequency (RF) signal or the like.

As an example, the bottom electrode 1450 may include a first bottom electrode layer 1452 and a second bottom electrode layer 1454 disposed on the first bottom electrode layer 1452 and formed of a scandium-containing aluminum alloy.

The first bottom electrode layer 1452 may be formed of a conductive material such as molybdenum (Mo) or an alloy thereof. However, the material of the first bottom electrode layer 1452 is not limited to these examples, and the first bottom electrode layer 1452 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The top electrode 1470 may be disposed to cover at least a portion of the piezoelectric layer 160 disposed on the cavity C. The top electrode 1470 may be used as either one of an input electrode and an output electrode inputting and outputting, respectively, an electrical signal such as a radio-frequency (RF) signal, or the like. For example, in a case in which the bottom electrode 1450 is used as an input electrode, the top electrode 1470 may be used as an output electrode. In a case in which the bottom electrode 1450 is used as an output electrode, the top electrode 1470 may be used as an input electrode.

As an example, the top electrode 1470 may be formed of a conductive material such as molybdenum (Mo) or an alloy thereof. However, the material of the top electrode 1470 is not limited to these examples, and the top electrode 1470 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Figure 29:
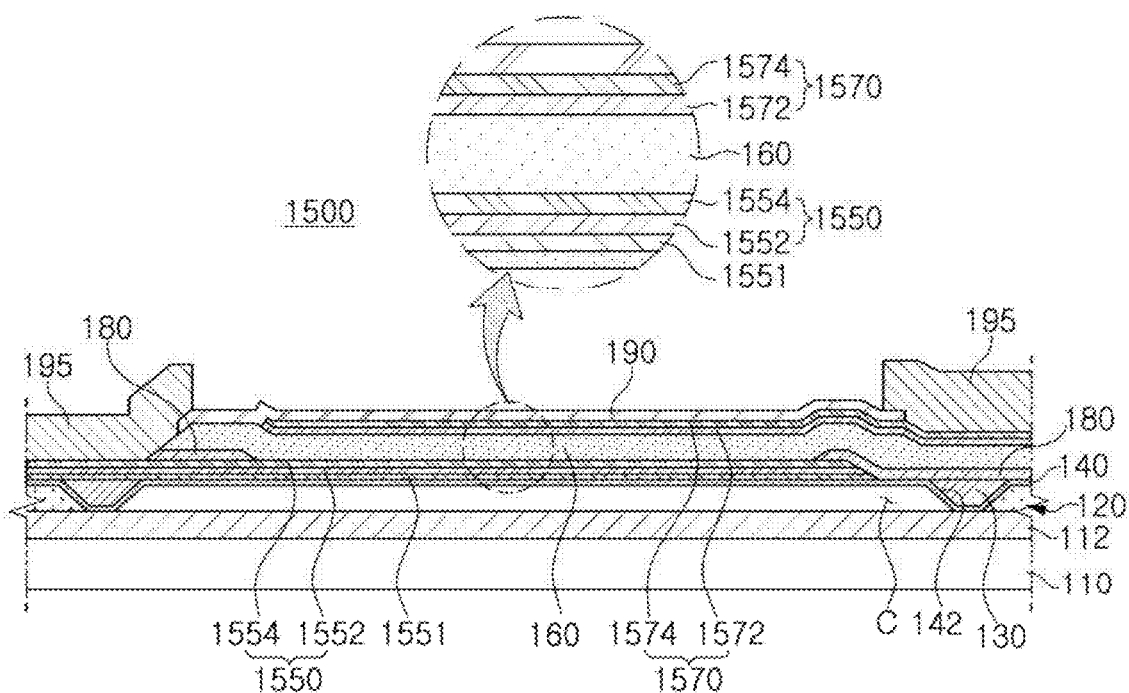
FIG. 29 is a schematic cross-sectional view of a bulk-acoustic wave resonator, according to another embodiment.

FIG. 29 is a schematic cross-sectional view of a bulk-acoustic wave resonator 1500, according to another embodiment.

Referring to FIG. 29, the bulk-acoustic wave resonator 1500 may include the substrate 110, the sacrificial layer 120, the etch stop portion 130, the membrane layer 140, a seed layer 1551, a bottom electrode 1550, the piezoelectric layer 160, a top electrode 1570, the insertion layer 180, the passivation layer 190, and the metal pad 195.

The bottom electrode 1550 may be disposed on the membrane layer 140, and a portion of the bottom electrode 1550 may be disposed on the cavity C. The bottom electrode 1550 may be used as either one of an input electrode and an output electrode inputting and outputting, respectively, an electrical signal such as a radio-frequency (RF) signal or the like.

As an example, the bottom electrode 1550 may include a first bottom electrode layer 1552 and a second bottom electrode layer 1554 disposed on the first bottom electrode layer 1552 and formed of a scandium-containing aluminum alloy.

The first bottom electrode layer 1552 may be formed of a conductive material such as molybdenum (Mo) or an alloy thereof. However, the material of the first bottom electrode layer 1552 is not limited to these examples, and the first bottom electrode layer 1552 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

The top electrode 1570 may be formed to cover at least a portion of the piezoelectric layer 160 disposed on the cavity C. The top electrode 1570 may be used as either one of an input electrode and an output electrode inputting and outputting, respectively, an electrical signal such as a radio-frequency (RF) signal, or the like. For example, in a case in which the bottom electrode 1550 is used as an input electrode, the top electrode 1570 may be used as an output electrode. In a case in which the bottom electrode 1550 is used as an output electrode, the top electrode 1570 may be used as an input electrode.

The top electrode 1570 may include a first top electrode layer 1572 and a second top electrode layer 1574 disposed on the first top electrode layer 1572 and formed of a scandium-containing aluminum alloy.

The first top electrode layer 1572 may be formed of a conductive material such as molybdenum (Mo) or an alloy thereof. However, the material of the first top electrode layer 1572 is not limited to these examples, and the first top electrode layer 1572 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys thereof.

Hereinafter, characteristics of the bulk acoustic wave resonators according to the embodiments of FIGS. 16 to 29 will be described through Table (4) below.

In the respective embodiments of FIGS. 16 to 29, the resonator had a size of 125×125 micrometers (μm), and a resonator frequency (Fs) was tuned to about 5 GHz. Doped aluminum nitride (AlScN) having a content of 6.25 at % of scandium (Sc) was used as the piezoelectric layer.

The seed layer was laminated below the bottom electrode to have a thickness of 500 Å. As described above, the seed layer had a hexagonal crystal structure such as titanium (Ti), ruthenium (Ru), or the like. The passivation layer was laminated above the top electrode to have a thickness of 1,000 Å and was formed of a silicon oxide (SiO).

As illustrated in Table (4) below, since an electrode thickness was increased when the top electrode and the bottom electrode including the layer of a scandium-aluminum alloy were used, insertion loss was reduced. In detail, when the bottom electrode including the layer of a scandium-containing aluminum alloy was used, crystal orientation of the piezoelectric layer AlScN was improved.

TABLE (4)

| EMB | STR | MAT | Fs (GHz) | T (Å) | EC (Insertion Loss, dB) | MC (Kt²) | COP |
|---|---|---|---|---|---|---|---|
| 1 | TE | AlSc | 4.97 | 1000 | 0.032 | 7.34 | 0.75 |
|  | PZE | AlScN |  | 6000 |  |  |  |
|  | BE | AlSc |  | 1500 |  |  |  |
| 2 | TE | AlSc | 5.04 | 1200 | 0.078 | 7.89 | 1.95 |
|  | PZE | AlScN |  | 5000 |  |  |  |
|  | BE | Mo |  | 1000 |  |  |  |
| 3 | TE | Mo | 4.91 | 1000 | 0.070 | 7.83 | 0.81 |
|  | PZE | AlScN |  | 5000 |  |  |  |
|  | BE | AlSc |  | 1500 |  |  |  |
| 4 | TE | AlSc | 5.01 | 1200 | 0.058 | 7.18 | 2.12 |
|  | PZE | AlScN |  | 4500 |  |  |  |
|  | BEL2 | Mo |  | 1000 |  |  |  |
|  | BEL1 | AlSc |  | 1000 |  |  |  |
| 5 | TEL2 | Mo | 4.98 | 500 | 0.084 | 7.01 | 1.32 |
|  | TEL1 | AlSc |  | 500 |  |  |  |
|  | PZE | AlScN |  | 4500 |  |  |  |
|  | BEL2 | AlSc |  | 500 |  |  |  |
|  | BEL1 | Mo |  | 500 |  |  |  |
| 6 | TEL2 | Mo | 4.91 | 500 | 0.086 | 7.98 | 2.01 |
|  | TEL1 | AlSc |  | 500 |  |  |  |
|  | PZE | AlScN |  | 4500 |  |  |  |
|  | BE | Mo |  | 1000 |  |  |  |
| 7 | TEL2 | AlSc | 5.09 | 1000 | 0.064 | 8.05 | 0.78 |
|  | TEL1 | Mo |  | 500 |  |  |  |
|  | PZE | AlScN |  | 5500 |  |  |  |
|  | BE | AlSc |  | 1000 |  |  |  |
| 8 | TE | AlSc | 5.06 | 1200 | 0.071 | 7.03 | 1.21 |
|  | PZE | AlScN |  | 5000 |  |  |  |
|  | BEL2 | AlSc |  | 500 |  |  |  |
|  | BEL1 | Mo |  | 500 |  |  |  |
| 9 | TEL2 | AlSc | 5.05 | 1000 | 0.061 | 7.95 | 2.27 |
|  | TEL1 | Mo |  | 500 |  |  |  |
|  | PZE | AlScN |  | 4500 |  |  |  |
|  | BEL2 | Mo |  | 500 |  |  |  |
|  | BEL1 | AlSc |  | 1000 |  |  |  |
| 10 | TEL2 | AlSc | 4.94 | 1000 | 0.073 | 8.46 | 2.01 |
|  | TEL1 | Mo |  | 500 |  |  |  |
|  | PZE | AlScN |  | 4500 |  |  |  |
|  | BE | Mo |  | 1000 |  |  |  |
| 11 | TEL2 | Mo | 5.06 | 500 | 0.076 | 7.59 | 0.78 |
|  | TEL1 | AlSc |  | 500 |  |  |  |
|  | PZE | AlScN |  | 5500 |  |  |  |
|  | BE | AlSc |  | 1000 |  |  |  |
| 12 | TE | Mo | 4.98 | 1000 | 0.068 | 8.47 | 2.28 |
|  | PZE | AlScN |  | 4000 |  |  |  |
|  | BEL2 | Mo |  | 800 |  |  |  |
|  | BEL1 | AlSc |  | 1000 |  |  |  |
| 13 | TEL2 | Mo | 5.07 | 500 | 0.078 | 7.4 | 2.3 |
|  | TEL1 | AlSc |  | 600 |  |  |  |
|  | PZE | AlScN |  | 4500 |  |  |  |
|  | BEL2 | Mo |  | 500 |  |  |  |
|  | BEL1 | AlSc |  | 600 |  |  |  |
| 14 | TE | Mo | 4.96 | 1000 | 0.086 | 8.01 | 1.32 |
|  | PZE | AlScN |  | 4500 |  |  |  |
|  | BEL2 | AlSc |  | 500 |  |  |  |
|  | BEL1 | Mo |  | 500 |  |  |  |
| 15 | TEL2 | AlSc | 5.04 | 1000 | 0.061 | 7.95 | 1.29 |
|  | TEL1 | Mo |  | 500 |  |  |  |
|  | PZE | AlScN |  | 4500 |  |  |  |
|  | BEL2 | AlSc |  | 1000 |  |  |  |
|  | BEL1 | Mo |  | 500 |  |  |  |

EMB: Embodiment
STR: Structure
MAT: Material
Fs: Resonator Frequency
T: Thickness
EC: Electrical Characteristics
MC: Mechanical Characteristics
COP: Crystal Orientation of Piezoelectric Layer
TE: Top Electrode
BE: Bottom Electrode
PZE: Piezoelectric Layer
TEL1: First Top Electrode layer
TEL2: Second Top Electrode Layer
BEL1: First Bottom Electrode Layer
BEL2: Second Bottom Electrode Layer FIG. 30 is a schematic cross-sectional view of a bulk-acoustic wave resonator 1600, according to another embodiment.

Figure 30:
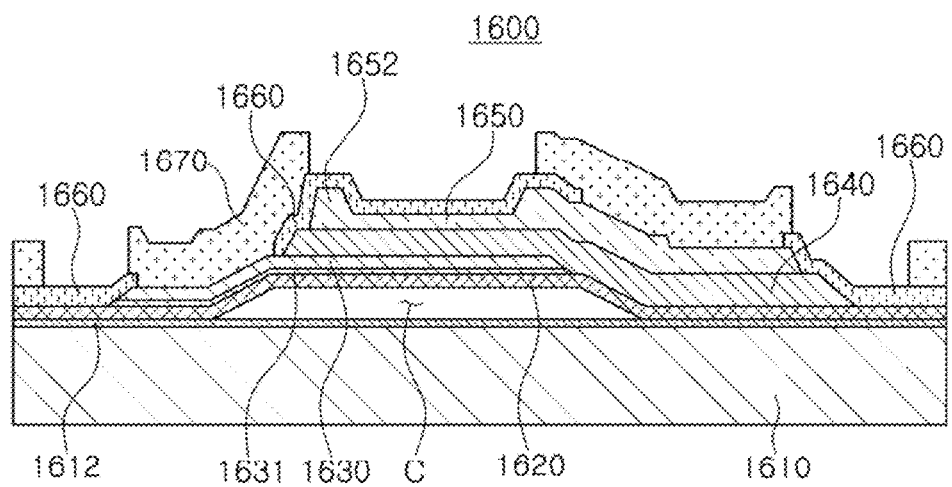
FIG. 30 is a schematic cross-sectional view of a bulk-acoustic wave resonator, according to another embodiment.

Referring to FIG. 30, the bulk-acoustic wave resonator 1600 may include a substrate 1610, a membrane layer 1620, a seed layer 1631, a bottom electrode 1630, a piezoelectric layer 1640, a top electrode 1650, a passivation layer 1660, and a metal pad 1670.

The substrate 1610 may be a substrate on which silicon is laminated. For example, a silicon wafer may be used as the substrate 1610. The substrate 1610 may include a substrate protective layer 1612 disposed to oppose a cavity C.

The substrate protective layer 1612 may prevent damage to the substrate 1610 when the cavity C is formed.

As an example, the substrate protective layer 1612 may be formed of any one or any combination of any two or more of silicon dioxide ($SiO_2$), silicon nitride ($Si_3N_4$), aluminum oxide ($Al_2O_3$), and aluminum nitride (AlN), and may be formed by any one of a chemical vapor deposition process, an RF magnetron sputtering process, and an evaporation process.

The membrane layer 1620 may be formed on a sacrificial layer, not illustrated, which is ultimately removed, and may form the cavity C together with the substrate protective layer 1612 through removal of the sacrificial layer. For example, the formation of the cavity C may be achieved by forming the sacrificial layer, not illustrated, on the substrate 1610 and removing the sacrificial layer. The membrane layer 1620 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO).

The bottom electrode 1630 may be disposed on the membrane layer 1620. The bottom electrode 1630 may be used as either one of an input electrode and an output electrode inputting and outputting, respectively, an electrical signal such as a radio-frequency (RF) signal or the like.

The bottom electrode 1630 may be formed of a scandium-containing aluminum alloy. As such, the bottom electrode 1630 may be formed of the scandium-containing aluminum alloy (Sc), such that high power reactive sputtering may be performed as mechanical strength is increased. Under such a deposition condition, an increase in surface roughness of the bottom electrode 1630 may be prevented and high orientation growth of the piezoelectric layer 1640 may also be induced.

Since scandium (Sc) is contained in the bottom electrode 1630, chemical resistance of the bottom electrode 1630 may be increased to address issues caused when the bottom electrode is formed of pure aluminum. Moreover, during a manufacturing process, stability of a process such as dry etching or wet etching may be provided. Furthermore, in the case in which the bottom electrode is formed of pure aluminum, oxidation is easily caused, but since the bottom electrode 1630 is formed of the scandium-containing aluminum alloy, chemical resistance against oxidation may be improved.

The piezoelectric layer 1640 may be disposed to cover at least a portion of the bottom electrode 1630. The piezoelectric layer 1640 is a portion in which a piezoelectric effect, which converts electric energy into mechanical energy in a form of an elastic wave, occurs. The piezoelectric layer 1640 may be formed of any one of aluminum nitride (AlN), zinc oxide (ZnO), and lead zirconium titanium oxide (PZT; PbZrTiO). In a case in which the piezoelectric layer 1640 is formed of aluminum nitride (AlN), the piezoelectric layer 1640 may further include a rare earth metal. As an example, the rare earth metal may include any one or any combination of any two or more of scandium (Sc), erbium (Er), yttrium (Y), and lanthanum (La). As an example, the transition metal may include at least one of titanium (Ti), zirconium (Zr), hafnium (Hf), tantalum (Ta), and niobium (Nb). As an example, the transition metal may also include magnesium (Mg), which is a divalent metal.

The top electrode 1650 may be formed to cover at least a portion of the piezoelectric layer 1640 disposed on the cavity C. The top electrode 1650 may be used as either one of an input electrode and an output electrode inputting and outputting, respectively, an electrical signal such as a radio-frequency (RF) signal, or the like. For example, in a case in which the bottom electrode 1630 is used as an input electrode, the top electrode 1650 may be used as an output electrode. In a case in which the bottom electrode 1630 is used as an output electrode, the top electrode 1650 may be used as an input electrode.

Similarly to the bottom electrode 1630, the top electrode 1650 may also be formed of a scandium-containing aluminum.

The top electrode 1650 may include a frame portion 1652 disposed at an edge of an active region, for example, a region in which the bottom electrode 1630, the piezoelectric layer 1640, and the top electrode 1650 overlap each other. The frame portion 1652 has a greater thickness than the other portions of the top electrode 1650. As an example, the frame portion 1652 reflects a lateral wave, generated during resonance, to an inside of the active region to trap resonance energy in the active region.

The passivation layer 1660 is disposed on the bottom electrode 1630 and a region of the top electrode 1650 except for a portion of the top electrode 1650. The passivation layer 1660 prevents damage to the top electrode 1650 and the bottom electrode 1630 during a manufacturing process.

In a final manufacturing process, a thickness of the passivation layer 1660 may be adjusted by etching to adjust a frequency of the passivation layer 1660. The passivation layer 1660 may use the same material as a material for use in the membrane layer 1620. As an example, the passivation layer 1660 may be a dielectric layer containing any one of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

The metal pad 1670 is disposed on a portion of the bottom electrode 1630 and the top electrode 1650 in which the passivation layer 1660 is not formed. As an example, the metal pad 1670 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy or an aluminum-scandium (Al—Sc) alloy.

Figure 31:
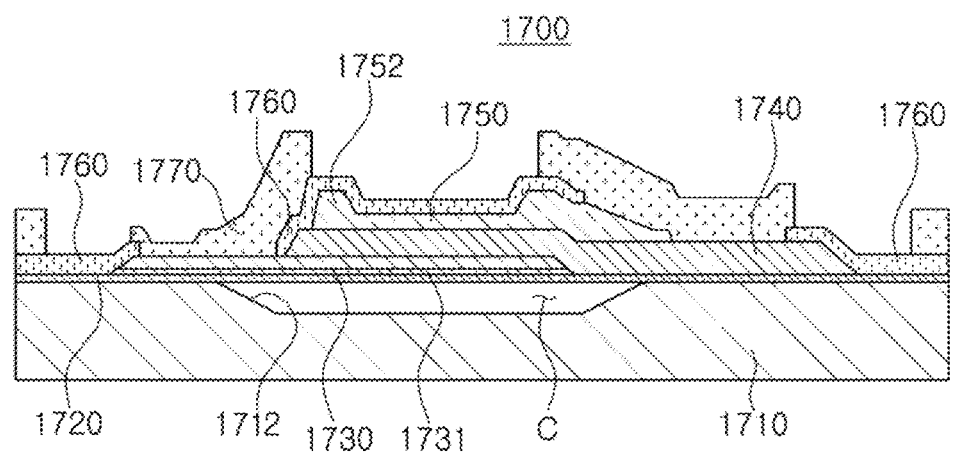
FIG. 31 is a schematic cross-sectional view of a bulk-acoustic wave resonator, according to another embodiment.

FIG. 31 is a schematic cross-sectional view of a bulk-acoustic wave resonator 1700, according to another embodiment.

Referring to FIG. 30, the bulk-acoustic wave resonator 1700 may include a substrate 1710, a membrane layer 1720, a seed layer 1731, a bottom electrode 1730, a piezoelectric layer 1740, a top electrode 1750, a passivation layer 1760, and a metal pad 1770.

The substrate 1710 may be a substrate on which silicon is laminated. For example, a silicon wafer may be used as the substrate 1710. The substrate 1710 may be provided with a groove 1712 for forming a cavity C.

The groove 1712 may be disposed in a central portion of the substrate 1710 and may be disposed below an active region. The term "active region" refers to a region in which the bottom electrode 1730, the piezoelectric layer 1740, and the top electrode 1750 all overlap each other.

The membrane layer 1720 may form the cavity C together with the substrate 1710. For example, the membrane layer 1720 may be formed to cover the groove 1712 of the substrate 1710. The membrane layer 1720 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO).

The bottom electrode 1730 may be disposed on the membrane layer 1720. The bottom electrode 1730 may be used as either one of an input electrode and an output electrode inputting and outputting, respectively, an electrical signal such as a radio-frequency (RF) signal or the like.

The bottom electrode 1730 may be formed of a scandium-containing aluminum alloy. As such, the bottom electrode 1730 may be formed of the scandium-containing aluminum alloy (Sc), such that high power reactive sputtering may be performed as mechanical strength is increased. Under such deposition conditions, an increase in surface roughness of the bottom electrode 1730 may be prevented and high orientation growth of the piezoelectric layer 1740 may also be induced.

Since scandium (Sc) is contained in the bottom electrode 1730, chemical resistance of the bottom electrode 1730 may be increased to address issues caused when the bottom electrode is formed of pure aluminum. Moreover, during the manufacturing process, stability of a process such as dry etching or wet etching may be provided. Furthermore, in the case in which the bottom electrode is formed of pure aluminum, oxidation is easily caused, but since the bottom electrode 1730 is formed of the scandium-containing aluminum alloy, chemical resistance against oxidation may be improved.

The piezoelectric layer 1740 may be disposed to cover at least a portion of the bottom electrode 1730. The piezoelectric layer 1740 is a portion in which a piezoelectric effect, which converts electric energy into mechanical energy in a form of an elastic wave, occurs. The piezoelectric layer 1740 may be formed of any one of aluminum nitride (AlN), zinc oxide (ZnO), and lead zirconium titanium oxide (PZT; PbZrTiO). In a case in which the piezoelectric layer 1740 is formed of aluminum nitride (AlN), the piezoelectric layer 1640 may further include a rare earth metal. As an example, the rare earth metal may include any one or any combination of any two or more of scandium (Sc), erbium (Er), yttrium (Y), and lanthanum (La). As an example, the transition metal may include at least one of titanium (Ti), zirconium (Zr), hafnium (Hf), tantalum (Ta), and niobium (Nb). The transition metal may also include magnesium (Mg), which is a divalent metal.

The top electrode 1750 may be formed to cover at least a portion of the piezoelectric layer 1740 disposed on the cavity C. The top electrode 1750 may be used as any one of an input electrode and an output electrode inputting and outputting, respectively, an electrical signal such as a radio-frequency (RF) signal, or the like. For example, in a case in which the bottom electrode 1730 is used as an input electrode, the top electrode 1750 may be used as an output electrode. In a case in which the bottom electrode 1730 is used as an output electrode, the top electrode 1750 may be used as an input electrode.

Similarly to the bottom electrode 1730, the top electrode 1750 may also be formed of a scandium-containing aluminum alloy.

The top electrode 1759 may include a frame portion 1752 disposed at an edge of the active region. The frame portion 1752 may have a thickness greater than a thickness of the other portions of the top electrode 1750. As an example, the frame portion 1752 may reflect a lateral wave, generated during the resonance, into the active region to trap resonance energy in the active region.

The passivation layer 1760 may be disposed on the bottom electrode 1730 and a region of the top electrode except for a portion of the top electrode 1750. The passivation layer 1760 may prevent damage to the top electrode 1750 and the bottom electrode 1730 during a process.

In a final manufacturing process, a thickness of the passivation layer 1760 may be adjusted by etching to adjust a frequency of the passivation layer 1760. The passivation layer 1760 may include the same material as the membrane layer 1720. As an example, the passivation layer 1760 may be a dielectric layer containing any one of manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO).

The metal pad 1770 may be formed on the bottom electrode 1630 and a portion of the top electrode 1750 on which the passivation layer 1760 is not formed. As an example, the metal pad 1770 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy or an aluminum-scandium (Al—Sc) alloy.

Figure 32:
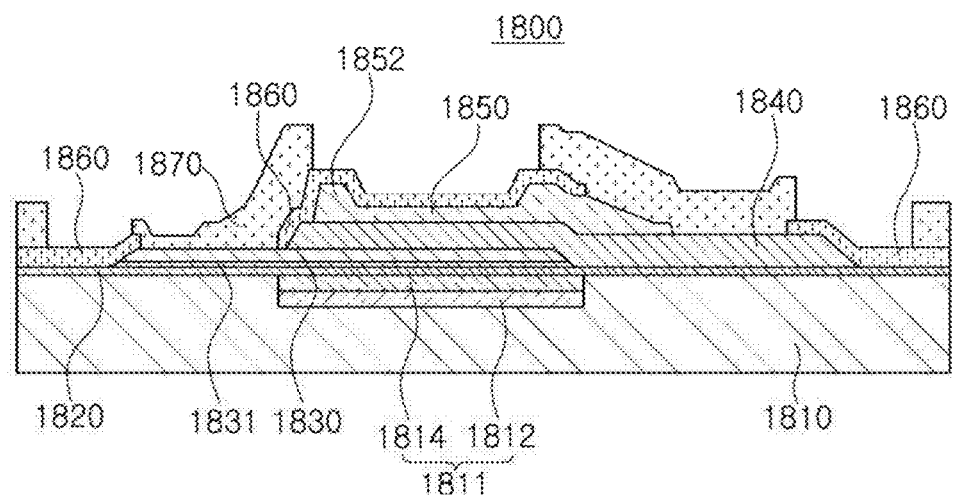
FIG. 32 is a schematic cross-sectional view of a bulk-acoustic wave resonator, according to another embodiment.

FIG. 32 is a schematic cross-sectional view of a bulk-acoustic wave resonator 1800, according to another embodiment.

Referring to FIG. 32, the bulk-acoustic wave resonator 1800 may include a substrate 1810, a membrane layer 1820, a seed layer 1831, a bottom electrode 1830, a piezoelectric layer 1840, a top electrode 1850, a passivation layer 1860, and a metal pad 1870.

The substrate 1810 may be a substrate on which silicon is laminated. For example, a silicon wafer may be used as the substrate 1810. The substrate 1810 may include a reflective layer 1821.

The reflective layer 1811 may be disposed in a central portion of the substrate 1810 and may be disposed below an active region. The term "active region" refers to a region in which the bottom electrode 1830, the piezoelectric layer 1840, and the top electrode 1850 are all disposed to overlap each other.

The reflective layer 1811 may include first and second reflective members 1812 and 1814 disposed in a groove. The first and second reflective members 1812 and 1814 may be formed of different materials to each other.

The first reflective member 1812 may be formed of a conductive material such as molybdenum (Mo), or an alloy thereof. However, the material of the first reflective member 1812 is not limited to these examples, and the first reflective member 1812 may be formed of ruthenium (Ru), tungsten (W), iridium (Ir), platinum (Pt), copper (Cu), aluminum (Al), titanium (Ti), tantalum (Ta), nickel (Ni), chromium (Cr), or the like. The second reflective member 1812 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO). The first and second reflective members 1812 and 1814 may be formed as a pair, or the first and second reflective members 1812 and 1814 may be repeatedly formed as a pair.

The membrane layer 1820 may be disposed to cover the reflective layer 1811 of the substrate 1810. The membrane layer 1820 may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO).

The bottom electrode 1830 may be disposed on the membrane layer 1820. The bottom electrode 1830 may be used as either one of an input electrode and an output electrode inputting and outputting, respectively, an electrical signal such as a radio-frequency (RF) signal or the like.

As an example, the bottom electrode 1830 may be formed of a scandium-containing aluminum alloy. As such, the bottom electrode 1830 may be formed of the scandium-containing aluminum alloy (Sc), such that high power reactive sputtering may be performed as mechanical strength is increased. Under such a deposition condition, an increase in surface roughness of the bottom electrode 1830 may be prevented and high orientation growth of the piezoelectric layer 1840 may also be induced.

Since scandium (Sc) is contained in the bottom electrode 1830, chemical resistance of the bottom electrode 1830 may be increased to address issues caused when the bottom electrode is formed of pure aluminum. Moreover, during a manufacturing process, stability of a process such as dry etching or wet etching may be provided. Furthermore, in the case in which the bottom electrode is formed of pure aluminum, oxidation is easily caused, but since the bottom electrode 1830 is formed of the aluminum alloy including scandium, chemical resistance against oxidation may be improved.

The piezoelectric layer 1840 may cover at least a portion of the bottom electrode 1830. The piezoelectric layer 1840 is a portion in which a piezoelectric effect, converting electric energy into mechanical energy in a form of an elastic wave, occurs. The piezoelectric layer 1840 may be formed of any one of aluminum nitride (AlN), zinc oxide (ZnO), and lead zirconium titanium oxide (PZT; PbZrTiO). In detail, in a case in which the piezoelectric layer 1840 is formed of aluminum nitride (AlN), the piezoelectric layer 1840 may further include a rare earth metal. As an example, the rare earth metal may include any one or any combination of any two or more of scandium (Sc), erbium (Er), yttrium (Y), and lanthanum (La). As an example, the transition metal may include any one or any combination of any two or more of titanium (Ti), zirconium (Zr), hafnium (Hf), tantalum (Ta), and niobium (Nb). The transition metal may also include magnesium (Mg), a divalent metal.

The top electrode 1850 may be formed to cover at least a portion of the piezoelectric layer 1840 disposed on the cavity C. The top electrode 1850 may be used as either one of an input electrode and an output electrode inputting and outputting, respectively, an electrical signal such as a radio-frequency (RF) signal, or the like. For example, in the case in which the bottom electrode 1830 is used as an input electrode, the top electrode 1850 may be used as an output electrode. In the case in which the bottom electrode 1830 is used as an output electrode, the top electrode 1850 may be used as an input electrode.

Similarly to the bottom electrode 1830, the top electrode 1850 may also be formed of a scandium-containing aluminum alloy.

The top electrode 1850 may include a frame portion 1852 disposed at an edge of the active region. The frame portion 1852 may have a greater thickness than the other portions of the top electrode 1850. As an example, the frame portion 1852 may reflect a lateral wave, generated during a resonance, to the active region to trap resonance energy in the active region.

The passivation layer 1860 may be disposed on the bottom electrode 1830 and a region of the top electrode 1850 except for a portion of the top electrode 1850. The passivation layer 1860 may prevent damage to the top electrode 1850 and the bottom electrode 1830 during the manufacturing process.

In a final process, a thickness of the passivation layer 1860 may be adjusted by etching to adjust a frequency of the passivation layer 1860. The passivation layer 1860 may uses the same material as a material for use in the membrane layer 1620. As an example, the passivation layer 1860 may be a dielectric layer containing any one of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO)

The metal pad 1870 may be disposed on the bottom electrode 1830 and a portion of the top electrode 1850 on which the passivation layer 1860 is not formed. As an example, the metal pad 1870 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy or an aluminum-scandium (Al—Sc) alloy.

Figure 33:
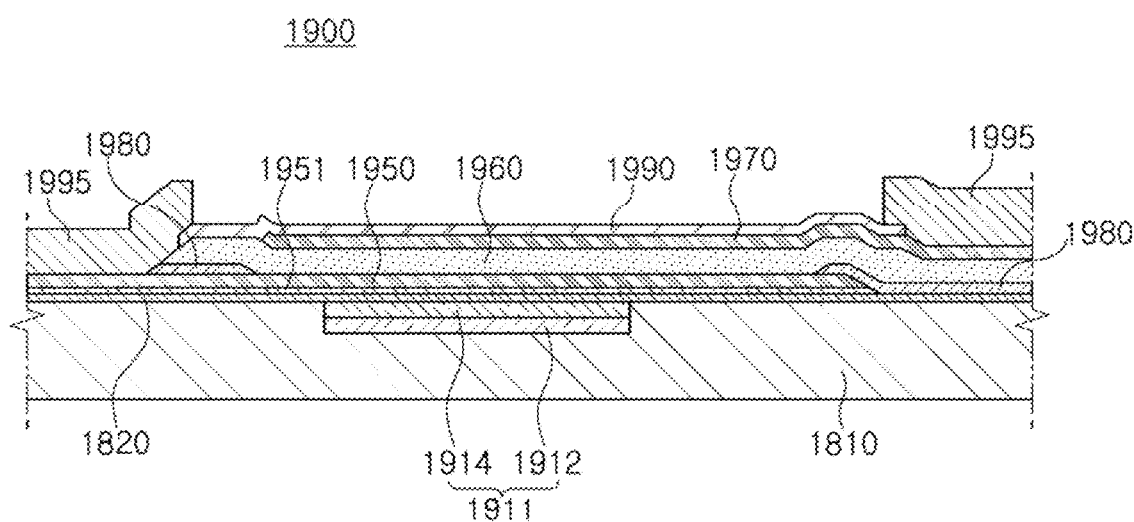
FIG. 33 is a schematic cross-sectional view of a bulk-acoustic wave resonator, according to another embodiment.

FIG. 33 is a schematic cross-sectional view of a bulk-acoustic wave resonator 1900, according to another embodiment.

Referring to FIG. 33, the bulk-acoustic wave resonator 1900 may include the substrate 1810, the membrane layer 1820, a seed layer 1951, a bottom electrode 1950, a piezoelectric layer 1960, a top electrode 1970, an insertion layer 1980, a passivation layer 1990, and a metal pad 1995.

Since the substrate 1810 and the membrane layer 1820 included in the bulk-acoustic wave resonator 1900 are the same components as the corresponding components included in the bulk-acoustic wave resonator 1800, detailed descriptions of the substrate 1810 and the membrane layer 1820 will not be repeated.

Since the bottom electrode 1950, the piezoelectric layer 1960, the top electrode 1970, the insertion layer 1980, the passivation layer 1990, and the metal pad 1995 included in the bulk-acoustic wave resonator 1900 are the same components as the bottom electrode 150, the piezoelectric layer 160, the top electrode 170, the insertion layer 180, the passivation layer 190, and the metal pad 195 included in the bulk-acoustic wave resonator 100, detailed descriptions thereof will be omitted and will be replaced with the descriptions above.

The insertion layer 1980 may be disposed between the bottom electrode 1950 and the piezoelectric layer 1960. The insertion layer 1980 may be formed of a dielectric such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from a material of the piezoelectric layer 1960. A region in which the insertion layer 1980 is formed may also be formed as an air space, as needed, which may be implemented by removing the insertion layer 1980 during the manufacturing process.

According to the embodiment of FIG. 33, a thickness of the insertion layer 1980 may be equal to or similar to a thickness of the bottom electrode 1950. The thickness of the insertion layer 1980 may be similar to or less than the thickness of the piezoelectric layer 1960. For example, the thickness of the insertion layer 1980 may be 100 Å or more, and may be less than the thickness of the piezoelectric layer 1960. However, the configurations of the insertion layer 1980, the bottom electrode 1950, and the piezoelectric layer 1960 are not limited to the above description.

Since the insertion layer 1980 is the same component as the insertion layer 180 included in the above-described bulk-acoustic wave resonator 100, a detailed description thereof will be omitted and will be replaced with the description above.

As described above, a bulk-acoustic wave resonator may reduce degradation in performance in a driving condition of a high frequency (for example, 6 GHz) and may be easily manufactured.

Moreover, when a bulk-acoustic wave resonator configured to operate in a band of 4 to 6 GHz is implemented, electrical loss may be reduced and crystal orientation of the piezoelectric layer may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
   a substrate;
   a seed layer disposed on the substrate, and having a hexagonal crystal structure;
   a bottom electrode disposed on the seed layer;
   a piezoelectric layer at least partially disposed on the bottom electrode and having a (0002) crystal surface of an HCP crystal structure; and
   a top electrode disposed on the piezoelectric layer,
   wherein the bottom electrode comprises a scandium (Sc)-containing aluminum alloy layer with a face centered cubic (FCC) crystal structure oriented in a (111) crystal surface disposed on the seed layer.

2. The bulk-acoustic wave resonator of claim 1, wherein the seed layer comprises titanium (Ti).

3. The bulk-acoustic wave resonator of claim 1, wherein the seed layer comprises ruthenium (Ru).

4. The bulk-acoustic wave resonator of claim 1, wherein the bottom electrode and the top electrode each comprise the scandium (Sc)-containing aluminum alloy layer.

5. The bulk-acoustic wave resonator of claim 4, wherein the top electrode further comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

6. The bulk-acoustic wave resonator of claim 4, wherein the bottom electrode further comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

7. The bulk-acoustic wave resonator of claim 1, wherein the top electrode comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

8. The bulk-acoustic wave resonator of claim 7, wherein the bottom electrode further comprises another layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

9. The bulk-acoustic wave resonator of claim 1, wherein a content of scandium (Sc) in the scandium (Sc)-containing aluminum alloy layer is in a range of 0.1 to 5 atomic percent (at %).

10. The bulk-acoustic wave resonator of claim 1, wherein the piezoelectric layer comprises an aluminum nitride or a doped aluminum nitride containing a rare earth metal.

11. The bulk-acoustic wave resonator of claim 10, wherein the doped aluminum nitride comprises a dopant selected from the group consisting of scandium (Sc), erbium (Er), yttrium (Y), and lanthanum (La), or combinations of scandium (Sc), erbium (Er), yttrium (Y), and lanthanum (La), and a content of the dopant in the doped aluminum nitride is in a range of 0.1 to 30 at %.

12. The bulk-acoustic wave resonator of claim 1, further comprising:
    an etch stop portion disposed between the substrate and the bottom electrode, and disposed around a cavity.

13. The bulk-acoustic wave resonator of claim 1, further comprising:
    an insertion layer disposed below a region of a portion of the piezoelectric layer.

14. The bulk-acoustic wave resonator of claim 1, wherein a cavity is formed on the substrate or in the substrate.

15. The bulk-acoustic wave resonator of claim 1, wherein the top electrode comprises a frame portion disposed at an edge of an active region of the bulk-acoustic wave resonator.

16. The bulk-acoustic wave resonator of claim 1, further comprising:
    a reflective layer embedded in a groove on the substrate or laminated on the substrate.

17. The bulk-acoustic wave resonator of claim 16, wherein the reflective layer comprises a first reflective member, and a second reflective member disposed on the first reflective member, and
    the first and second reflective members are provided as a pair, or are provided as a plurality of pairs in which the first and second reflective members are alternately disposed.

18. The bulk-acoustic wave resonator of claim 1, wherein a lattice mismatch of the seed layer with the bottom electrode is in a range from 3% to 6%.

* * * * *